US010895807B2

(12) United States Patent
Shuto et al.

(10) Patent No.: US 10,895,807 B2
(45) Date of Patent: Jan. 19, 2021

(54) CURED FILM AND POSITIVE PHOTOSENSITIVE RESIN COMPOSITION

(71) Applicant: TORAY INDUSTRIES, INC., Tokyo (JP)

(72) Inventors: Yuta Shuto, Otsu (JP); Satoshi Kamemoto, Otsu (JP); Kazuto Miyoshi, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 163 days.

(21) Appl. No.: 16/075,306

(22) PCT Filed: Mar. 8, 2017

(86) PCT No.: PCT/JP2017/009158
§ 371 (c)(1),
(2) Date: Aug. 3, 2018

(87) PCT Pub. No.: WO2017/159476
PCT Pub. Date: Sep. 21, 2017

(65) Prior Publication Data
US 2018/0356727 A1  Dec. 13, 2018

(30) Foreign Application Priority Data

Mar. 18, 2016  (JP) ................. 2016-055385

(51) Int. Cl.
*G03F 7/022* (2006.01)
*G03F 7/039* (2006.01)
(Continued)

(52) U.S. Cl.
CPC .......... *G03F 7/0226* (2013.01); *G03F 7/0233* (2013.01); *G03F 7/039* (2013.01);
(Continued)

(58) Field of Classification Search
CPC ................................. H01L 23/49894
(Continued)

(56) References Cited

U.S. PATENT DOCUMENTS 4,720,445 A * 1/1988 Brahim ................ G03F 7/0233
430/192
2011/0159428 A1   6/2011 Lee et al.
2017/0162638 A1 * 6/2017 Nendai ................ H01L 51/56

FOREIGN PATENT DOCUMENTS

EP  0163202 A2  12/1985
JP  61-6827 A    1/1986
(Continued)

OTHER PUBLICATIONS

International Search Report, issued in PCT/JP2017/009158, PCT/ISA/210, dated May 16, 2017.
(Continued)

*Primary Examiner* — Ian A Rummel
(74) *Attorney, Agent, or Firm* — Birch, Stewart, Kolasch & Birch, LLP

(57) ABSTRACT

The invention provides a cured film and a positive type photosensitive resin composition unlikely to cause a decrease in light emission luminance or shrinkage of pixels and high in long term reliability.
[Solution] The invention provides a cured film comprising a cured product of a photosensitive resin composition including an alkali-soluble resin (a), a photoacid generating agent (b), at least one compound (c) selected from the group consisting of cyclic amides, cyclic ureas, and derivatives thereof, and a thermal crosslinking agent (d), the thermal crosslinking agent (d) containing an epoxy compound, oxetanyl compound, isocyanate compound, acidic group-containing alkoxymethyl compound, and/or acidic group-containing methylol compound, and the total content of the compound (c) in the cured film being 0.005 mass % or more
(Continued)

and 5 mass % or less. The photosensitive resin composition comprises the alkali-soluble resin (a), photoacid generating agent (b), compound (c), thermal crosslinking agent (d), and an organic solvent (e), the compound (c) accounting for 0.1 part by mass or more and 15 parts by mass or less relative to 100 parts by mass of the alkali-soluble resin (a), and the organic solvent (e) accounting for 100 to 3,000 parts by mass relative thereto.

10 Claims, 1 Drawing Sheet

(51) Int. Cl.
  *G03F 7/16*    (2006.01)
  *G03F 7/20*    (2006.01)
  *G03F 7/32*    (2006.01)
  *G03F 7/40*    (2006.01)
  *H01L 27/32*    (2006.01)
  *H01L 23/498*    (2006.01)
  *G03F 7/023*    (2006.01)

(52) U.S. Cl.
  CPC .............. *G03F 7/162* (2013.01); *G03F 7/168* (2013.01); *G03F 7/2004* (2013.01); *G03F 7/322* (2013.01); *G03F 7/40* (2013.01); *H01L 27/3258* (2013.01); *H01L 23/49894* (2013.01); *H01L 27/3246* (2013.01)

(58) Field of Classification Search
  USPC ....................................................... 428/195.1
  See application file for complete search history.

(56) References Cited

FOREIGN PATENT DOCUMENTS

| | | |
|---|---|---|
| JP | 2009-258634 A | 11/2009 |
| JP | 2011-138133 A | 7/2011 |
| JP | 2017-72744 A | 4/2017 |
| TW | 201026652 A | 7/2010 |
| TW | 201434972 A | 9/2014 |
| WO | WO 2014/115233 A1 | 7/2014 |
| WO | WO 2015/087830 A1 | 6/2015 |

OTHER PUBLICATIONS

Written Opinion of the International Searching Authority, issued in PCT/JP2017/009158, PCT/ISA/237, dated May 16, 2017.

* cited by examiner

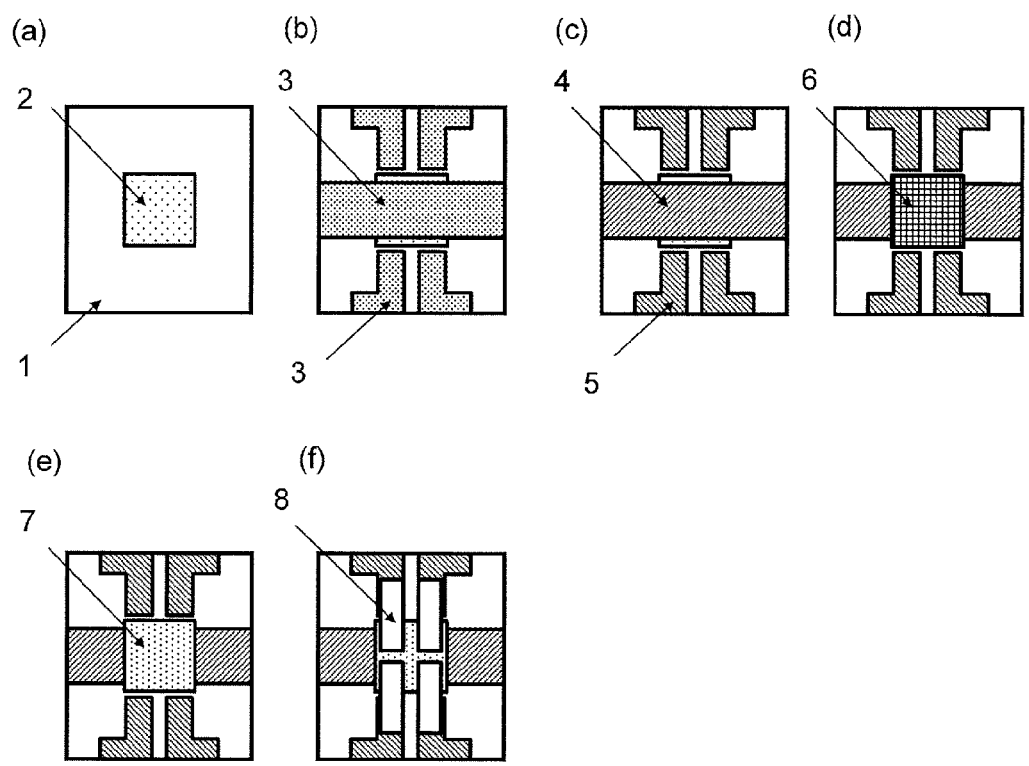

CURED FILM AND POSITIVE PHOTOSENSITIVE RESIN COMPOSITION

TECHNICAL FIELD

The present invention relates to a cured film and a positive type photosensitive resin composition. More specifically, it relates to a cured film suitable for use as the insulation film in an organic electroluminescent (hereinafter abbreviated as EL) element and as the substrate planarizing film in a thin film transistor (hereinafter abbreviated as TFT) for driving a displaying device containing an organic EL element and also relates to a positive type photosensitivity resin composition for forming the cured film as well as applications and a production method for the cured film.

BACKGROUND ART

Organic EL display devices are now attracting attention as components of next generation flat panel displays. An organic EL display device is a self-luminous type display device utilizing electroluminescence from an organic compound and able to display images with a wide view angle, high-speed response, and high contrast. Having a potential of made thinner and lighter, organic EL display devices have become a major focus of research and development in recent years.

Organic EL display devices, however, have the problem of being poor in long term reliability. Organic luminescent materials are generally low in resistance to gas components and moisture, and if exposed to them, they can suffer a decrease in light emission luminance or shrinkage of pixels. Here, the term "shrinkage of pixels" means the phenomenon of a decrease in light emission luminance or lighting failure at the edges of pixels. To provide a display element with improved long term reliability, it is essential not only to develop an organic luminescence material with increased durability, but also to develop peripheral materials, such as planarizing layer covering the drive circuit and insulation layer covering the first electrode, that have improved characteristics. If made of a photosensitive resin composition, a planarizing layer and insulation layer as described above can be processed easily into desired patters. In particular, the use of a positive type photosensitive resin composition is preferred because of being suitable for alkali development with a high resolution.

Most positive type photosensitive resin compositions proposed so far are mixtures of an alkali-soluble resin and an o-quinone diazide compound as photosensitive component, and they commonly use a polyimide precursor (see, for example, Patent document 1) or a polybenzoxazole precursor (see, for example, Patent document 2) as the resin.

PRIOR ART DOCUMENTS

Patent Documents

[Patent document 1] Japanese Unexamined Patent Publication (Kokai) No. 2002-91343
[Patent document 2] Japanese Unexamined Patent Publication (Kokai) No. 2002-116715

SUMMARY OF THE INVENTION

Problems to be Solved by the Invention

The materials proposed in the above Patent documents, however, cannot be said to show required performance in terms of long term reliability although they are preferred from the viewpoint of being able to provide an insulation layer having a forward tapered cross section. In view of the above problems, an object of the present invention is to provide a cured film and a positive type photosensitive resin composition that ensures a long term reliability without causing a decrease in light emission luminance or shrinkage of pixels.

Means for Solving the Problems

The cured film according to the present invention is composed mainly of a cured product of a photosensitive resin composition including an alkali-soluble resin (a), a photoacid generating agent (b), at least one compound (c) selected from the group consisting of cyclic amides, cyclic ureas, and derivatives thereof, and a thermal crosslinking agent (d), the thermal crosslinking agent (d) containing an epoxy compound, oxetanyl compound, isocyanate compound, acidic group-containing alkoxymethyl compound, and/or acidic group-containing methylol compound, and the total content of the compound (c) in the cured film being 0.005 mass % or more and 5 mass % or less.

The positive type photosensitive resin composition according to the present invention includes an alkali-soluble resin (a), a photoacid generating agent (b), at least one compound (c) selected from the group consisting of cyclic amides, cyclic ureas, and derivatives thereof, a thermal crosslinking agent (d), and an organic solvent (e), the thermal crosslinking agent (d) containing an epoxy compound, oxetanyl compound, isocyanate compound, acidic group-containing alkoxymethyl compound, and/or acidic group-containing methylol compound, the compound (c) accounting for 0.1 part by mass or more and 15 parts by mass or less relative to 100 parts by mass of the alkali-soluble resin (a), and the organic solvent (e) accounting for 100 to 3,000 parts by mass relative thereto.

Advantageous Effect of the Invention

The cured film and the positive type photosensitive resin composition according to the present invention ensure a long term reliability without causing a decrease in light emission luminance or shrinkage of pixels. The use of the cured film and the positive type photosensitive resin composition make it possible to provide an organic EL display device high in long term reliability.

BRIEF DESCRIPTION OF THE DRAWINGS

FIG. 1(a) to (f) are schematic diagrams illustrating a typical method for producing a substrate for an organic EL display device.

DESCRIPTION OF PREFERRED EMBODIMENTS

An embodiment of the present invention is described in detail below.

As a result of intensive studies, the present inventors have found that some acidic gases generated in trace amounts from insulation layers are a factor in the decrease in long term reliability of an organic EL device. More specifically, acidic gases, such as sulfur dioxide, carbon dioxide, and hydrogen sulfide, generated from planarizing layers or insulation layers are accumulated near the interface between an electrode and a luminescence layer to cause the phenomenon called shrinkage of pixels, i.e., a decrease in light emission luminance or lighting failure at the edges of pixels.

The present inventors found that this problem can be solved according to the two embodiments described below.

The first embodiment of the present invention provides a cured film that is composed mainly of a cured product of a photosensitive resin composition including an alkali-soluble resin (a), a photoacid generating agent (b), at least one compound (c) selected from the group consisting of cyclic amides, cyclic ureas, and derivatives thereof, and a thermal crosslinking agent (d), the thermal crosslinking agent (d) containing an epoxy compound, oxetanyl compound, isocyanate compound, acidic group-containing alkoxymethyl compound, and/or acidic group-containing methylol compound, and the total content of the compound (c) in the cured film being 0.005 mass % or more and 5 mass % or less. When used in planarizing layers or insulation layers, this serves to prevent a decrease in light emission luminance or shrinkage of pixels and provide an organic EL device having high long-term reliability.

The second embodiment of the present invention provides a positive type photosensitive resin composition that includes an alkali-soluble resin (a), a photoacid generating agent (b), at least one compound (c) selected from the group consisting of cyclic amides, cyclic ureas, and derivatives thereof, a thermal crosslinking agent (d), and an organic solvent (e), the thermal crosslinking agent (d) containing an epoxy compound, oxetanyl compound, isocyanate compound, acidic group-containing alkoxymethyl compound, and/or acidic group-containing methylol compound, the compound (c) accounting for 0.1 part by mass or more and 15 parts by mass or less relative to 100 parts by mass of the alkali-soluble resin (a), and the organic solvent (e) accounting for 100 to 3,000 parts by mass relative thereto. When used in planarizing layers or insulation layers, this positive type photosensitive resin composition serves to prevent a decrease in light emission luminance or shrinkage of pixels and provide an organic EL device having high long-term reliability.

Here, the cured film according to the first embodiment can be produced by curing the positive type photosensitive resin composition according to the second embodiment.

First, the first embodiment is described in detail.

In the cured film according to the present invention, the total content of the at least one compound (c) selected from the group consisting of cyclic amides, cyclic ureas, and derivatives thereof is 0.005 mass % or more and 5 mass % or less. It is considered that if at least one compound (c) selected from the group consisting of cyclic amides, cyclic ureas, and derivatives thereof is contained, the compound (c) works as a quencher for acidic gases to serve to prevent a decrease in light emission luminance or shrinkage of pixels and provide an organic EL device having high long-term reliability.

The content by mass % of the at least one compound (c) selected from the group consisting of cyclic amides, cyclic ureas, and derivatives thereof in the cured film can be determined by examining a specimen taken from the cured film by the purge-and-trap method, the TPD-MS method, or the like to measure the mass of the compounds and analyzing the measurements based on the specific gravity of the alkali-soluble resin (a) component to calculate the content by mass % of the compound (c) in the cured film.

The total content of the at least one compound (c) selected from the group consisting of cyclic amides, cyclic ureas, and derivatives thereof in the cured film is preferably 0.005 mass % or more, more preferably 0.05 mass % or more, and preferably 5 mass % or less, more preferably 3 mass % or less, relative to the total mass of the cured film. The quencher effect can be invoked if it is 0.005 mass % or more, whereas the outgassing of the compounds themselves, which can cause a decrease in reliability, can be prevented if it is 3 mass % or less.

The photosensitive resin composition used in the cured film according to the present invention contains an alkali-soluble resin (a). For the present invention, alkali-solubility test is performed by dissolving a resin sample in γ-butyrolactone to prepare a solution, spreading it over a silicon wafer, prebaking it at 120° C. for 4 minutes to form a prebaked film with a film thickness of 10 μm±0.5 μm, immersing the prebaked film in an aqueous solution containing 2.38 parts by mass of tetramethyl ammonium hydroxide at 23±1° C. for 1 minute, rinsing it with pure water, and determining the dissolution rate from the decrease in film thickness, and the resin is judged to be alkali-soluble if the rate is 50 nm/min or more.

Specific examples of the alkali-soluble resin (a) include, but not limited to, polyimide, polyimide precursors, polybenzoxazole, polybenzoxazole precursors, polyaminoamide, polyamide, polymers obtainable from radical-polymerizable monomers having alkali-soluble groups, cardo resin, phenol resin, cyclic olefin polymers, and siloxane resin. Two or more of these resins may be contained together. Of these alkali-soluble resins, those with a high heat resistance and a smaller outgassing rate at high temperatures are preferred. Specifically, it is preferable to use one or more alkali-soluble resins selected from the group consisting of polyimide, polyimide precursors, polybenzoxazole, polybenzoxazole precursors, and copolymers thereof.

Alkali-soluble resins selected from the group consisting of polyimide, polyimide precursors, polybenzoxazole, polybenzoxazole precursors, and copolymers thereof that can serve as the alkali-soluble resin (a) preferably has an acidic group such as, for example, carboxyl group, phenolic hydroxyl group, and sulfonic acid group in the structural unit of the resin and/or at the chain end of the backbone thereof to develop such alkali-solubility as described above. In addition, it is preferable to contain fluorine atoms, because they work to develop water repellency at the interface between the film and the base material in the development step that uses the aqueous alkali solution to prevent the infiltration of the aqueous alkali solution to the interface. The content of the fluorine atoms is preferably 5 parts by mass or more relative to 100 parts by mass of the alkali-soluble resin from the viewpoint of effective prevention of the infiltration of the aqueous alkali solution to the interface, whereas it is preferably 20 parts by mass or less relative thereto from the viewpoint of its solubility in the aqueous alkali solution.

A polyimide compound as described above has a structural unit as represented by general formula (2) given below, whereas a polyimide precursor and a polybenzoxazole precursor have a structural unit as represented by general formula (3) given below. Two or more of these alkali-soluble resins may be contained, and a copolymer resin of a structural unit as represented by general formula (2) and a structural unit as represented by general formula (3) may be used.

[Chemical compound 1]

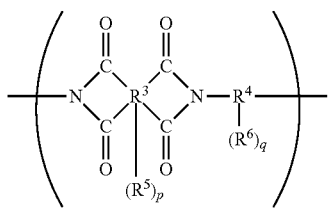

(2)

In general formula (2), $R^3$ is a tetravalent to decavalent organic group, and $R^4$ is a divalent to octavalent organic group. $R^5$ and $R^6$ are each a carboxyl group or a phenolic hydroxyl group and may be identical to or different from each other. Furthermore, p and q are each an integer of 0 to 6.

[Chemical compound 2]

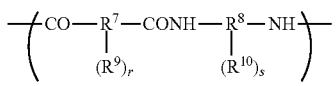

(3)

In general formula (3), $R^7$ is a divalent to octavalent organic group, and $R^8$ is a divalent to octavalent organic group. $R^9$ and $R^{19}$ each denote a phenolic hydroxyl group or $COOR^{11}$ and may be identical to or different from each other. $R^{11}$ denotes a hydrogen atom or a monovalent hydrocarbon group containing 1 to 20 carbon atoms. Furthermore, r and s are each an integer of 0 to 6. Here, the relation of r+s>0 holds.

The alkali-soluble resin, which is selected from the group consisting of polyimide, polyimide precursors, polybenzoxazole, polybenzoxazole precursors, and copolymers thereof, preferably contains 5 to 100,000 structural units that are represented by general formula (2) or (3). It may contain another structural unit in addition to the structural units that are represented by general formula (2) or (3). In this case, it is preferable for the structural units that are represented by general formula (2) or (3) to account for 50 mol % or more of the total number of structural units.

In general formula (2) given above, $R^3$—$(R^4)_p$ represents an acid dianhydride residue. $R^3$ is a tetravalent to decavalent organic group and in particular, it is preferably an organic group containing 5 to 40 carbon atoms and having an aromatic ring or a cyclic aliphatic group.

Specific examples of the acid dianhydride include pyromellitic acid dianhydride, 3,3',4,4'-biphenyl tetracarboxylic acid dianhydride, 2,3,3',4'-biphenyl tetracarboxylic acid dianhydride, 2,2',3,3'-biphenyl tetracarboxylic acid dianhydride, 3,3',4,4'-benzophenone tetracarboxylic acid dianhydride, 2,2',3,3'-benzophenone tetracarboxylic acid dianhydride, 2,2-bis(3,4-dicarboxyphenyl) propane dianhydride, 2,2-bis(2,3-dicarboxyphenyl) propane dianhydride, 1,1-bis(3,4-dicarboxyphenyl) ethane dianhydride, 1,1-bis(2,3-dicarboxyphenyl) ethane dianhydride, bis(3,4-dicarboxyphenyl) methane dianhydride, bis(2,3-dicarboxyphenyl) methane dianhydride, bis(3,4-dicarboxyphenyl) ether dianhydride, 1,2,5,6-naphthalene tetracarboxylic acid dianhydride, 9,9-bis(3,4-dicarboxyphenyl) fluorene acid dianhydride, 9,9-bis{4-(3,4-dicarboxyphenoxy) phenyl} fluorene acid dianhydride, 2,3,6,7-naphthalene tetracarboxylic acid dianhydride, 2,3,5,6-pyridine tetracarboxylic acid dianhydride, 3,4,9,10-perylene tetracarboxylic acid dianhydride, and 2,2-bis(3,4-dicarboxyphenyl) hexafluoropropane dianhydride, as well as aromatic tetracarboxylic acid dianhydrides such as those dianhydrides having structures as shown below and aliphatic tetracarboxylic acid dianhydrides such as butane tetracarboxylic acid dianhydride and 1,2,3,4-cyclopentane tetracarboxylic acid dianhydride. Two or more of these may be used in combination.

[Chemical compound 3]

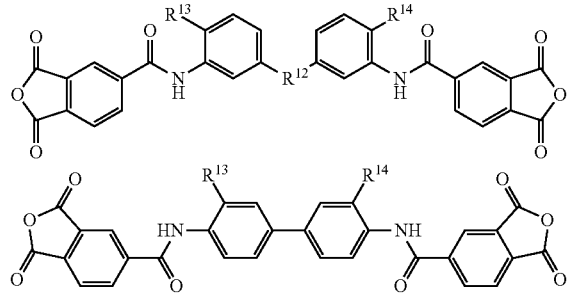

($R^{12}$ denotes an oxygen atom, $C(CF_3)_2$, or $C(CH_3)_2$. $R^{13}$ and $R^{14}$ are each a hydrogen atom or a hydroxyl group.

In general formula (3) given above, $R^7$—$(R^9)_r$ represents an acid residue. $R^7$ is a divalent to octavalent organic group and in particular, it is preferably an organic group containing 5 to 40 carbon atoms and having an aromatic ring or a cyclic aliphatic group.

Examples of the acid components include dicarboxylic acids such as terephthalic acid, isophthalic acid, diphenyl ether dicarboxylic acid, bis(carboxyphenyl) hexafluoropropane, biphenyl dicarboxylic acid, benzophenone dicarboxylic acid, and triphenyl dicarboxylic acid; tricarboxylic acids such as trimellitic acid, trimesic acid, diphenyl ether tricarboxylic acid, and biphenyl tricarboxylic acid; and tetracarboxylic acids including aromatic tetracarboxylic acids such as pyromellitic acid, 3,3',4,4'-biphenyl tetracarboxylic acid, 2,3,3',4'-biphenyl tetracarboxylic acid, 2,2',3,3'-biphenyl tetracarboxylic acid, 3,3',4,4'-benzophenone tetracarboxylic acid, 2,2',3,3'-benzophenone tetracarboxylic acid, 2,2-bis(3,4-dicarboxyphenyl) hexafluoropropane, 2,2-bis(2,3-dicarboxyphenyl) hexafluoropropane, 1,1-bis(3,4-dicarboxyphenyl) ethane, 1,1-bis(2,3-dicarboxyphenyl) ethane, bis(3,4-dicarboxyphenyl) methane, bis(2,3-dicarboxyphenyl) methane, bis(3,4-dicarboxyphenyl) ether, 1,2,5,6-naphthalene tetracarboxylic acid, 2,3,6,7-naphthalene tetracarboxylic acid, 2,3,5,6-pyridine tetracarboxylic acid, 3,4,9,10-perylene tetracarboxylic acid, and others having structures as shown below, and aliphatic tetracarboxylic acids such as butane tetracarboxylic acid and 1,2,3,4-cyclopentane tetracarboxylic acid. Two or more of these may be used in combination.

[Chemical compound 4]

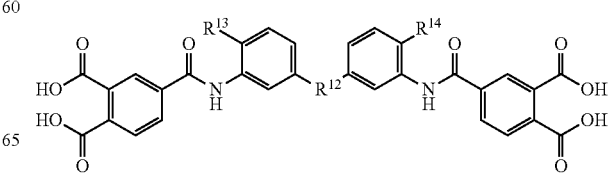

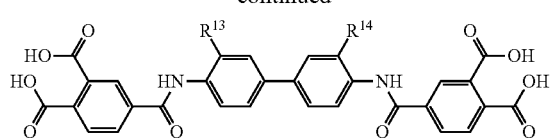

($R^{12}$ denotes an oxygen atom, $C(CF_3)_2$, or $C(CH_3)_2$. $R^{13}$ and $R^{14}$ are each a hydrogen atom or a hydroxyl group.

In tricarboxylic acids and tetracarboxylic acids, in particular, one or two carboxyl groups correspond to the $R^9$ group in general formula (3). In the dicarboxylic acids, tricarboxylic acids, and tetracarboxylic acids given above, it is preferable for one to four hydrogen atoms to be substituted by $R^9$ groups as represented by general formula (3), more preferably substituted by hydroxyl groups. These acids may be used in their original form or in the form of an anhydride or an active ester.

$R^4$—$(R^6)_q$ in general formula (2) given above and $R^8$—$(R^{10})_s$ in general formula (3) given above each represent a diamine residue. $R^4$ and $R^{10}$ are each a divalent to octavalent organic group and in particular, it is preferably an organic group containing 5 to 40 carbon atoms and having an aromatic ring or a cycloaliphatic group.

Specific examples of the diamine include 3,4'-diaminodiphenyl ether, 4,4'-diaminodiphenyl ether, 3,4'-diaminodiphenyl methane, 4,4'-diaminodiphenyl methane, 1,4-bis(4-aminophenoxy) benzene, benzidine, m-phenylene diamine, p-phenylene diamine, 1,5-naphthalene diamine, 2,6-naphthalene diamine, bis(4-aminophenoxy) biphenyl, bis{4-(4-aminophenoxy) phenyl} ether, 1,4-bis(4-aminophenoxy) benzene, 2,2'-dimethyl-4,4'-diaminobiphenyl, 2,2'-diethyl-4,4'-diaminobiphenyl, 3,3'-dimethyl-4,4'-diaminobiphenyl, 3,3'-diethyl-4,4'-diaminobiphenyl, 2,2',3,3'-tetramethyl-4,4'-diaminobiphenyl, 3,3',4,4'-tetramethyl-4,4'-diaminobiphenyl, 2,2'-di(trifluoromethyl)-4,4'-diaminobiphenyl, and 9,9-bis(4-aminophenyl) fluorine; compounds listed above in which at least part of the hydrogen atoms in the aromatic rings are substituted by alkyl groups or halogen atoms; aliphatic cyclohexyl diamines and methylene biscyclohexyl amines; and diamines having structures as given below. Two or more of these may be used in combination.

[Chemical compound 5]

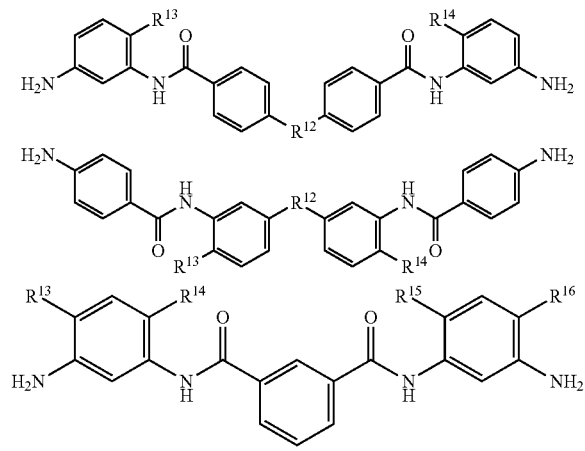

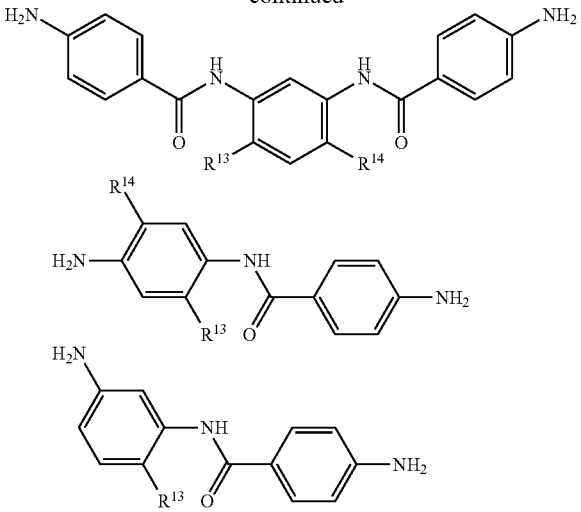

$R^{12}$ denotes an oxygen atom, $C(CF_3)_2$, or $C(CH_3)_2$. $R^{13}$ to $R^{16}$ are each a hydrogen atom or a hydroxyl group.

These diamines may be used in the form of the original diamines or in the form of corresponding diisocyanate compounds or trimethylsilylated diamines.

The chain ends of these alkali-soluble resins may be capped by a monoamine having an acidic group, acid anhydride, acid chloride, or monocarboxylic acid to form alkali-soluble resins having acidic groups at backbone chain ends.

Preferable examples of these monoamines include 5-amino-8-hydroxyquinoline, 1-hydroxy-7-aminonaphthalene, 1-hydroxy-6-aminonaphthalene, 1-hydroxy-5-aminonaphthalene, 1-hydroxy-4-aminonaphthalene, 2-hydroxy-7-aminonaphthalene, 2-hydroxy-6-aminonaphthalene, 2-hydroxy-5-aminonaphthalene, 1-carboxy-7-aminonaphthalene, 1-carboxy-6-aminonaphthalene, 1-carboxy-5-aminonaphthalene, 2-carboxy-7-aminonaphthalene, 2-carboxy-6-aminonaphthalene, 2-carboxy-5-aminonaphthalene, 2-aminobenzoic acid, 3-aminobenzoic acid, 4-aminobenzoic acid, 4-aminosalicylic acid, 5-aminosalicylic acid, 6-aminosalicylic acid, 3-amino-4,6-dihydroxy pyrimidine, 2-aminophenol, 3-aminophenol, 4-aminophenol, 2-aminothiophenol, 3-aminothiophenol, and 4-aminothiophenol. Two or more of these may be used in combination.

Preferable examples of these acid anhydrides, acid chlorides, and monocarboxylic acids include acid anhydrides such as phthalic anhydride, maleic anhydride, nadic anhydride, cyclohexanedicarboxylic anhydride, and 3-hydroxyphthalic anhydride; monocarboxylic acids such as 3-carboxyphenol, 4-carboxyphenol, 3-carboxythiophenol, 4-carboxythiophenol, 1-hydroxy-7-carboxynaphthalene, 1-hydroxy-6-carboxynaphthalene, 1-hydroxy-5-carboxynaphthalene, 1-mercapto-7-carboxynaphthalene, 1-mercapto-6-carboxynaphthalene, and 1-mercapto-5-carboxynaphthalene; those monoacid chloride compounds that can be produced therefrom by converting their carboxyl groups into acid chloride groups; those monoacid chloride compounds that can be produced from dicarboxylic acids such as terephthalic acid, phthalic acid, maleic acid, cyclohexanedicarboxylic acid, 1,5-dicarboxynaphthalene, 1,6-dicarboxynaphthalene, 1,7-dicarboxynaphthalene, and 2,6-dicarboxynaphthalene by converting only one of their carboxyl groups into an acid chloride group; and active ester compounds that can be produced by reacting a monoacid chloride compound with N-hydroxybenzotriazole or N-hydroxy-5-norbornene-2,3-dicarboxyimide. Two or more of these may be used in combination.

The aforementioned end capping agents such as monoamine, acid anhydride, acid chloride, and monocarboxylic acid preferably account for 2 to 25 mol % of the total quantity, which accounts for 100 mol %, of the acids and amine components present in the alkali-soluble resin.

End capping agents introduced in an alkali-soluble resin can be detected easily by methods as described below. For example, a resin specimen containing an end capping agent is dissolved in an acidic solution to decompose it into amine components and acid components, that is, constituent units of the resin, and then the end capping agent can be detected easily by gas chromatography (GC) or NMR spectroscopy. In another method, detection can be carried out by subjecting a resin specimen containing an end capping agent directly to pyrolysis gas chromatograph (PGC), infrared spectroscopy, or $^{13}$C-NMR spectroscopy.

The alkali-soluble resin (a) is synthesized by a generally known method. In the case where the alkali-soluble resin is a polyamic acid and polyamic acid ester, good production methods include, for example, a method in which a tetracarboxylic acid dianhydride and a diamine compound are reacted at a low temperature, a method in which a diester is obtained from a tetracarboxylic acid dianhydride and an alcohol, followed by its reaction with an amine in the presence of a condensation agent, a method in which a diester is obtained from a tetracarboxylic acid dianhydride and an alcohol, followed by conversion of the remaining dicarboxylic acid into an acid chloride and its reaction with an amine.

In the case where the alkali-soluble resin is polyhydroxyamide which is a polybenzoxazole precursor, its production can be achieved by subjecting a bisaminophenol compound and a dicarboxylic acid to condensation reaction. More specifically, good production methods include a method in which a dehydration-condensation agent such as dicyclohexyl carbodiimide (DCC) and an acid are reacted, followed by adding a bisaminophenol compound and a method in which a tertiary amine such as pyridine is added to a solution of a bisaminophenol compound, followed by dropping it to a solution of a dicarboxylic acid dichloride.

In the case where the alkali-soluble resin is a polyimide, it can be produced by, for example, heating a polyamic acid or polyamic acid ester as prepared by the aforementioned method or subjecting them to chemical treatment with an acid or a salt group to cause dehydration cyclization.

In the case where the alkali-soluble resin is a polybenzoxazole, it can be produced by, for example, heating a polybenzoxazole precursor (polyhydroxyamide) as prepared by the aforementioned method or subjecting it to chemical treatment with an acid or a salt group to cause dehydration cyclization.

To produce a polymer including radical-polymerizable monomers with alkali-soluble groups that can be used as the alkali-soluble resin (a), radical-polymerizable monomers with phenolic hydroxyl groups or carboxyl groups are used to develop alkali-solubility. Such radical-polymerizable monomers with phenolic hydroxyl groups or carboxyl groups include , for example, o-hydroxystyrene, m-hydroxystyrene, and p-hydroxystyrene, which may be substituted by an alkyl, alkoxy, halogen, haloalkyl, nitro, cyano, amide, ester, or carboxy group; polyhydroxyvinyl phenols such as vinyl hydroquinone, 5-vinyl pyrogallol, 6-vinyl pyrogallol, and 1-vinyl fluoroglycinol; o-vinyl benzoic acid, m-vinyl benzoic acid, and p-vinyl benzoic acid, which may be substituted by an alkyl, alkoxy, halogen, nitro, cyano, amide, or ester group; methacrylic acid and acrylic acid, which may be substituted by an α-haloalkyl, alkoxy, halogen, nitro, or cyano group; divalent unsaturated carboxylic acids such as maleic acid, maleic anhydride, fumaric acid, fumaric anhydride, citraconic acid, mesaconic acid, itaconic acid, and 1,4-cyclohexene dicarboxylic acid, as well as methyl, ethyl, propyl, i-propyl, n-butyl, sec-butyl, ter-butyl, phenyl, and o-, m-, p-toluyl half esters and half amides thereof.

Of these, o-hydroxystyrene, m-hydroxystyrene, and p-hydroxystyrene, which may be substituted by alkyl or alkoxy, have been preferred from the viewpoint of the sensitivity and resolution in the patterning step, proportion of the remaining film after the development step, heat-resistant deformability, solvent resistance, adhesion with the substrate, storage stability of the solution, etc. These monomers may be used singly or as a mixture of two or more thereof.

To produce a polymer including radical-polymerizable monomers with phenolic hydroxyl groups or carboxyl groups that can be used as the alkali-soluble resin (a), other radical-polymerizable monomers may be used. Useful examples of such other radical-polymerizable monomers include styrene, which may be substituted at the α-, o-, m-, or p-position by an alkyl, alkoxy, halogen, haloalkyl, nitro, cyano, amide, or ester group; diolefins such as butadiene, isoprene, and chloroprene; methacrylic acids and acrylic acids esterified with methyl, ethyl, n-propyl, i-propyl, n-butyl, sec-butyl, ter-butyl, pentyl, neopentyl, isoamylhexyl, cyclohexyl, adamanthyl, allyl, propargyl, phenyl, naphthyl, anthracenyl, anthraquinonyl, piperonyl, salicyl, cyclohexyl, benzyl, phenethyl, cresyl, glycidyl, 1,1,1-trifluoroethyl, perfluoroethyl, perfluoro-n-propyl, perfluoro-i-propyl, triphenylmethyl, tricyclo[5.2.1.0$^{2,6}$]decane-8-yl (commonly called dicyclopentenyl), cumyl, 3-(N,N-dimethylamino)propyl, 3-(N,N-dimethylamino)ethyl, furyl, or furfuryl; anilides and amides of methacrylic acid or acrylic acid; and N,N-dimethyl, N,N-diethyl, N,N-dipropyl, N,N-diisopropyl, anthranilamide, acrylonitrile, acrolein, methacrylonitrile, vinyl chloride, vinylidene chloride, vinyl fluoride, vinylidene fluoride, N-vinyl pyrrolidone, vinyl pyridine, vinyl acetate, N-phenyl maleinimide, N-(4-hydroxyphenyl) maleinimide, N-methacryloyl phthalimide, and N-acryloyl phthalimide. These may be used singly or as a mixture of two or more thereof.

Of these, styrene, which may be substituted by alkyl, alkoxy, halogen, or haloalkyl at the α-, o-, m-, or p-position; butadiene and isoprene; and esterification products of methacrylic acid or acrylic acid with methyl, ethyl, n-propyl, n-butyl, glycidyl, or tricycleo[5.2.1.0$^{2,6}$]decane-8-yl are particularly preferred from the viewpoint of the sensitivity and resolution in the patterning step, proportion of the remaining film after the development step, heat-resistant deformability, solvent resistance, adhesion with the substrate, storage stability of the solution, etc. When a copolymer of a radical-polymerizable monomer having a phenolic hydroxyl group and other radical-polymerizable monomer is used as the alkali-soluble resin, the other radical-polymerizable monomer preferably accounts for 40 parts by mass or less, particularly preferably 5 to 30 parts by mass, relative to the total quantity, which accounts for 100 parts by mass, of the radical-polymerizable monomer having a phenolic hydroxyl group and the other radical-polymerizable monomer. When a copolymer of a radical-polymerizable monomer having a carboxyl group and other radical-polymerizable monomer is used as the alkali-soluble resin, the other radical-polymerizable monomer preferably accounts for 90 parts by mass or less, particularly preferably 10 to 80 parts by mass, relative to the total quantity, which accounts for 100 parts by mass, of the radical-polymerizable monomer having a carboxyl group and the other radical-polymerizable monomer. Alkali development may be difficult to achieve if the proportion of these other radical-polymerizable monomers is larger than the aforementioned values specified for the radical-polymerizable monomers with phenolic hydroxyl groups or carboxyl groups.

Solvents useful for production of a polymer containing radical-polymerizable monomers with alkali-soluble groups include, for example, alcohols such as methanol and ethanol; ethers such as tetrahydrofuran; glycol ethers such as ethylene glycol monomethyl ether and ethylene glycol monoethyl ether; ethylene glycol alkyl ether acetates such as methyl cellosolve acetate and ethyl cellosolve acetate; diethylene glycols such as diethylene glycol monomethyl ether, diethylene glycol monoethyl ether, diethylene glycol dimethyl ether, diethylene glycol diethyl ether, and diethylene glycol ethyl methyl ether; propylene glycol monoalkyl ethers such as propylene glycol monomethyl ether, propylene glycol monoethyl ether, propylene glycol monopropyl ether, and propylene glycol monobutyl ether; propylene glycol alkyl ether acetates such as propylene glycol methyl ether acetate, propylene glycol ethyl ether acetate, propylene glycol propyl ether acetate, and propylene glycol butyl ether acetate; propylene glycol alkyl ether propionates such as propylene glycol methyl ether propionate, propylene glycol ethyl ether propionate, propylene glycol propyl ether propionate, and propylene glycol butyl ether propionate; aromatic hydrocarbons such as toluene and xylene; ketones such as methyl ethyl ketone, cyclohexanone, and 4-hydroxy-4-methyl-2-pentanone; and esters such as methyl acetate, ethyl acetate, propyl acetate, butyl acetate, ethyl 2-hydroxypropionate, methyl 2-hydroxy-2-methylpropionate, ethyl 2-hydroxy-2-methyl propionate, hydroxymethyl acetate, hydroxyethyl acetate, hydroxybutyl acetate, methyl lactate, ethyl lactate, propyl lactate, butyl lactate, methyl 3-hydroxypropionate, ethyl 3-hydroxypropionate, propyl 3-hydroxypropionate, butyl 3-hydroxypropionate, methyl 2-hydroxy-3-methylbutannoate, methyl methoxyacetate, ethyl methoxyacetate, propyl methoxyacetate, butyl methoxyacetate, methyl ethoxyacetate, ethyl ethoxyacetate, propyl ethoxyacetate, butyl ethoxyacetate, methyl propoxyacetate, ethyl propoxyacetate, propyl propoxyacetate, butyl propoxyacetate, methyl butoxyacetate, ethyl butoxyacetate, propyl butoxyacetate, butyl butoxyacetate, methyl 2-methoxypropionate, ethyl 2-methoxypropionate, propyl 2-methoxypropionate, butyl 2-methoxypropionate, methyl 2-ethoxypropionate, ethyl 2-ethoxypropionate, propyl 2-ethoxypropionate, butyl 2-ethoxypropionate, methyl 2-butoxypropionate, ethyl 2-butoxypropionate, propyl 2-butoxypropionate, butyl 2-butoxypropionate, methyl 3-methoxypropionate, ethyl 3-methoxypropionate, propyl 3-methoxypropionate, butyl 3-methoxypropionate, methyl 3-ethoxypropionate, ethyl 3-ethoxypropionate, propyl 3-ethoxypropionate, butyl 3-ethoxypropionate, methyl 3-propoxypropionate, ethyl 3-propoxypropionate, propyl 3-propoxypropionate, butyl 3-propoxypropionate, methyl 3-butoxypropionate, ethyl 3-butoxypropionate, propyl 3-butoxypropionate, and butyl 3-butoxypropionate. It is preferable for these solvents to account for 20 to 1,000 parts by mass relative to 100 parts by mass of the radical-polymerizable monomers.

Useful polymerization initiators for the production of a polymer containing a radical-polymerizable monomer with an alkali-soluble group include, for example, azo compounds such as 2,2'-azo-bis-isobutyronitrile, 2,2'-azo-bis-(2,4-dimethyl valeronitrile), and 2,2'-azo-bis-(4-methoxy-2,4-dimethyl valeronitrile); organic peroxides such as benzoyl peroxide, lauroyl peroxide, t-butyl peroxypivalate, and 1,1'-bis-(t-butyl peroxy) cyclohexane; and hydrogen peroxide. When adopting a peroxide as radical polymerization initiator, the peroxide may be used with a reduction agent to work as a redox type initiator.

Such a polymer containing a radical-polymerizable monomer with an alkali-soluble group preferably has a polystyrene based weight average molecular weight of 2,000 to 100,000, more preferably 3,000 to 50,000, and particularly preferably 5,000 to 30,000, as determined by gel permeation chromatography. Developability and sensitivity tend to deteriorate when the weight average molecular weight is more than 100,000, whereas the pattern shape, resolution, developability, and heat resistance tend to deteriorate when it is less than 2,000.

These polymers containing a radical-polymerizable monomer with an alkali-soluble group may be used singly or as a combination of two or more thereof. Another good alkali-soluble resin synthesis method is to introduce a protective group in the carboxyl group or phenolic hydroxyl group before polymerization and remove the protective group after polymerization to develop alkali-solubility. In addition, the transparency to visible light and the softening point may be controlled by hydrogenation etc.

A cardo resin can serve as the alkali-soluble resin (a) if its backbone has a cardo structure characterized by a cyclic structure having a quaternary carbon atom to which two other cyclic structures are bonded. A typical cardo structure is a combination of a fluorene ring and benzene rings bonded thereto.

Specific examples of such a backbone structure characterized by a cyclic structure having a quaternary carbon atom to which two other cyclic structures are bonded include fluorene backbone, bisphenol fluorene backbone, bisaminophenyl fluorene backbone, fluorene backbone having an epoxy group, and fluorene backbone having an acrylic group.

A cardo resin can be produced by polymerization of cardo structure-based backbones caused by reaction between functional groups bonded the backbones. A cardo resin has a structure (cardo structure) characterized by a backbone chain and bulky side chains each bonded thereto through one atom to form a cyclic structure extended nearly perpendicular to the backbone chain.

Specific examples of monomers having a cardo structure include cardo structure-containing bisphenols such as bis (glycidyloxyphenyl) fluorene type epoxy resin, 9,9-bis(4-hydroxyphenyl) fluorene, and 9,9-bis(4-hydroxy-3-methylphenyl) fluorene; 9,9-bis(cyanoalkyl) fluorenes such as 9,9-bis(cyanomethyl) fluorene; and 9,9-bis(aminoalkyl) fluorenes such as 9,9-bis(3-aminopropyl) fluorene.

The cardo resin is typically a polymer produced through polymerization of a monomer having a cardo structure, but it may be a copolymer with other copolymerizable monomers.

Generally known methods such as ring opening polymerization and addition polymerization can be used for the polymerization of the monomers described above.

Phenol resins useful as the alkali-soluble resin (a) include novolac phenol resins and resol phenol resins, which can be produced by subjecting a phenol or a mixture of a plurality of different phenols, selected from various available ones, to condensation polymerization with an aldehyde such as formalin.

The phenols that can serve for producing novolac phenol resins or resol phenol resins include, for example, phenol, p-cresol, m-cresol, o-cresol, 2,3-dimethyl phenol, 2,4-dimethyl phenol, 2,5-dimethyl phenol, 2,6-dimethyl phenol, 3,4-dimethyl phenol, 3,5-dimethyl phenol, 2,3,4-trimethyl phenol, 2,3,5-trimethyl phenol, 3,4,5-trimethyl phenol, 2,4,5-trimethyl phenol, methylene bisphenol, methylene bis-p-cresol, resorcin, catechol, 2-methyl resorcin, 4-methyl resorcin, o-chlorophenol, m-chlorophenol, p-chlorophenol, 2,3-dichlorophenol, m-methoxy phenol, p-methoxy phenol, p-butoxy phenol, o-ethyl phenol, m-ethyl phenol, p-ethyl phenol, 2,3-diethyl phenol, 2,5-diethyl phenol, p-isopropyl phenol, α-naphthol, and β-naphthol, which may be used singly or as a mixture of two or more thereof.

Useful aldehydes include, in addition to formalin, paraformaldehyde, acetoaldehyde, benzaldehyde, hydroxybenzaldehyde, and chloroacetoaldehyde, which may be used singly or as a mixture of two or more thereof.

It is preferable for a phenol resin used as the alkali-soluble resin (a) to have a polystyrene-based weight average molecular weight in the range of 2,000 to 50,000, more preferably in the range of 3,000 to 30,000, as determined by gel permeation chromatography. Developability and sensitivity tend to deteriorate when the weight average molecular weight is more than 50,000, whereas the pattern shape, resolution, developability, and heat resistance tend to deteriorate when it is less than 2,000.

Cyclic olefin polymers useful as the alkali-soluble resin (a) include homopolymers or copolymers of a cyclic olefin monomer having a cyclic structure (alicyclic or aromatic ring) and a carbon-carbon double bond. Such a cyclic olefin polymer may also contain a monomer that is not a cyclic olefin monomer.

Monomers useful to produce such a cyclic olefin polymer include cyclic olefin monomers having protonic polar groups, cyclic olefin monomers having non-protonic polar groups, cyclic olefin monomers having no polar groups, and non-cyclic-olefin monomers. Here, such non-cyclic-olefin monomers may have protonic polar groups or other polar groups or may be free of polar groups.

Specific examples of the cyclic olefin monomers having protonic polar groups include cyclic olefins containing carboxyl groups such as 5-hydroxycarbonyl bicyclo[2.2.1]hept-2-ene, 5-methyl-5-hydroxycarbonyl bicyclo[2.2.1]hept-2-ene, 5-carboxymethyl-5-hydroxycarbonyl bicyclo[2.2.1]hept-2-ene, 5-exo-6-endo-dihydroxycarbonyl bicyclo[2.2.1]hept-2-ene, 8-hydroxycarbonyl tetracyclo[4.4.0.12, 5.17,10]dodeca-3-ene, 8-methyl-8-hydroxycarbonyl tetracyclo[4.4.0.1$^{2,5}$.1$^{7,10}$]dodeca-3-ene, and 8-exo-9-endo-dihydroxycarbonyl tetracyclo[4.4.0.1$^{2,5}$.1$^{7,10}$]dodeca-3-ene; and cyclic olefins containing hydroxyl groups such as 5-(4-hydroxyphenyl) bicyclo[2.2.1]hept-2-ene, 5-methyl-5-(4-hydroxyphenyl) bicyclo[2.2.1]hept-2-ene, 8-(4-hydroxyphenyl) tetracyclo[4.4.0.1$^{2,5}$.1$^{7,10}$]dodeca-3-ene, and 8-methyl-8-(4-hydroxyphenyl) tetracyclo[4.4.0.1$^{2,5}$.1$^{7,10}$]dodeca-3-ene. These monomers may be used singly, or two or more thereof may be used in combination.

Specific examples of the cyclic olefin monomers having non-protonic polar groups include cyclic olefins having ester groups such as 5-acetoxy bicyclo[2.2.1]hept-2-ene, 5-methoxycarbonyl bicyclo[2.2.1]hept-2-ene, 5-methyl-5-methoxycarbonyl bicyclo[2.2.1]hept-2-ene, 8-acetoxy tetracyclo[4.4.0.1$^{2,5}$.1$^{7,10}$]dodeca-3-ene, 8-methoxycarbonyl tetracyclo[4.4.0.1$^{2,5}$,1$^{7,10}$]dodeca-3-ene, 8-ethoxycarbonyl tetracyclo[4.4.0.1$^{2,5}$,1$^{7,10}$]dodeca-3-ene, 8-n-propoxycarbonyl tetracyclo[4.4.0.11$^{2,5}$.1$^{7,10}$]dodeca-3-ene, 8-isopropoxycarbonyl tetracyclo[4.4.0.1$^{2,5}$.1$^{7,10}$]dodeca-3-ene, 8-n-butoxycarbonyl tetracyclo[4.4.0.1$^{2,5}$.1$^{7,10}$]dodeca-3-ene, 8-methyl-8-methoxycarbonyl tetracyclo[4.4.0.1$^{2,5}$.1$^{7,10}$]dodeca-3-ene, 8-methyl-8-ethoxycarbonyl tetracyclo[4.4.0.1$^{2,5}$.1$^{7,10}$]dodeca-3-ene, 8-methyl-8-n-propoxycarbonyl tetracyclo[4.4.0.1$^{2,5}$.1$^{7,10}$]dodeca-3-ene, 8-methyl-8-isopropoxycarbonyl tetracyclo[4.4.0.1$^{2,5}$.1$^{7,10}$]dodeca-3-ene, 8-methyl-8-n-butoxycarbonyl tetracyclo[4.4.0.1$^{2,5}$.1$^{7,10}$]dodeca-3-ene, 8-(2,2,2-trifluoroethoxycarbonyl) tetracyclo[4.4.0.1$^{2,5}$.1$^{7,10}$]dodeca-3-ene, and 8-methyl-8-(2,2,2-trifluoroethoxycarbonyl) tetracyclo[4.4.0.1$^{2,5}$.1$^{7,10}$]dodeca-3-ene; cyclic olefins having N-substitute imide groups such as N-phenyl-(5-norbornene-2,3-dicarboxyimide); cyclic olefins having cyano groups such as 8-cyanotetracyclo[4.4.0.1$^{2,5}$.1$^{7,10}$]dodeca-3-ene, 8-methyl-8-cyanotetracyclo[4.4.0.1$^{2,5}$.1$^{7,10}$]dodeca-3-ene, and 5-cyanobicyclo[2.2.1]hept-2-ene; and cyclic olefins having halogen atoms such as 8-chlorotetracyclo[4.4.0.1$^{2,5}$.1$^{7,10}$]dodeca-3-ene and 8-methyl-8-chlorotetracyclo[4.4.0.1$^{2,5}$.1$^{7,10}$]dodeca-3-ene. These monomers may be used singly, or two or more thereof may be used in combination.

Specific examples of the cyclic olefin monomers having no polar groups include bicyclo[2.2.1]hept-2-ene, 5-ethyl-bicyclo[2.2.1]hept-2-ene, 5-butyl-bicyclo[2.2.1]hept-2-ene, 5-ethylidene-bicyclo[2.2.1]hept-2-ene, 5-methylidene-bicyclo[2.2.1]hept-2-ene, 5-vinyl-bicyclo[2.2.1]hept-2-ene, tricyclo[4.3.0.1$^{2,5}$]deca-3,7-diene, tetracyclo[8.4.0.1$^{11,14}$.0$^{3,7}$]pentadeca-3,5,7,12, 11-pentaene, tetracyclo[4.4.0.1$^{2,5}$.1$^{7,10}$]deca-3-ene, 8-methyl-tetracyclo[4.4.0.1$^{2,5}$.1$^{7,10}$]dodeca-3-ene, 8-ethyl-tetracyclo[4.4.0.1$^{2,5}$.1$^{7,10}$]dodeca-3-ene, 8-methylidene-tetracyclo[4.4.0.1$^{2,5}$.1$^{7,10}$]dodeca-3-ene, 8-ethylidene-tetracyclo[4.4.0.1$^{2,5}$.1$^{7,10}$]dodeca-3-ene, 8-vinyl-tetracyclo[4.4.0.1$^{2,5}$.1$^{7,10}$]dodeca-3-ene, 8-propenyl-tetracyclo[4.4.0.1$^{2,5}$.1$^{7,10}$]dodeca-3-ene, pentacyclo[6.5.1.1$^{3,6}$.0$^{2,7}$.0$^{9,13}$]pentadeca-3,10-diene, cyclopentene, cyclopentadiene, 1,4-methano-1,4,4a, 5,10,10a-hexahydroanthracene, 8-phenyl-tetracyclo[4.4.0.1$^{2,5}$.1$^{7,10}$]dodeca-3-ene, tetracyclo[9.2.1.0$^{2,10}$.0$^{3,8}$]tetradeca-3,5,7,12-tetraene, pentacyclo[7.4.0.1$^{3,6}$.1$^{10,13}$.0$^{2,7}$]pentadeca-4,11-diene, and pentacyclo[9.2.1.1$^{4,7}$.0$^{2,10}$.0$^{3,8}$]pentadeca-5,12-diene. These monomers may be used singly, or two or more thereof may be used in combination.

Specific examples of non-cyclic-olefin monomers include α-olefins having 2 to 20 carbon atoms such as ethylene, propylene, 1-butene, 1-pentene, 1-hexene, 3-methyl-1-butene, 3-methyl-1-pentene, 3-ethyl-1-pentene, 4-methyl-1-pentene, 4-methyl-1-hexene, 4,4-dimethyl-1-hexene, 4,4-dimethyl-1-pentene, 4-ethyl-1-hexene, 3-ethyl-1-hexene, 1-octene, 1-decene, 1-dodecene, 1-tetradecene, 1-hexadecene, 1-octadecene, and 1-eicosene; and linear olefins such as 1,4-hexadiene, 4-methyl-1,4-hexadiene, 5-methyl-1,4-hexadiene, 1,7-octadiene, and other nonconjugated dienes. These monomers may be used singly, or two or more thereof may be used in combination.

Common methods can be used for the polymerization of cyclic olefin polymers from the monomers listed above. They include, for example, ring opening polymerization and addition polymerization.

Preferred polymerization catalysts for these methods include, for example, metal complexes of molybdenum, ruthenium, and osmium. These polymerization catalysts may be used singly or as a combination of two or more thereof.

For the cyclic olefin polymers produced through polymerization of the various monomers, hydrogenation is performed commonly using a hydrogenation catalyst. Examples of the hydrogenation catalyst include, for example, those commonly used for hydrogenation of olefin compounds.

Specifically, useful ones include Ziegler type homogeneous catalysts, noble metal complex catalysts, and supported type noble metal based catalysts.

Of these hydrogenation catalysts, noble metal complex catalysts such as of rhodium and ruthenium are preferable because they will not cause side reactions such as modification of functional groups and also because the unsaturated carbon-carbon bonds in the polymers will be hydrogenated selectively. Particularly preferable are highly electron donative, nitrogen-containing heterocyclic carbene compounds and ruthenium catalysts having coordinated phosphines.

Siloxane resins useful as the alkali-soluble resin (a) include polysiloxanes obtainable through hydrolysis condensation of at least one compound selected from the organosilanes represented by general formula (4) given below and the organosilanes represented by general formula (5) given below. The use of organosilanes represented by general formula (4) or (5) serves to obtain a photosensitive colored resin composition having a high sensitivity and resolution.

Organosilanes as represented by general formula (4) that are useful as the alkali-soluble resin (a) are as defined below.

[Chemical compound 6]

$(R^{17})_m Si(OR^{18})_{4-m}$ (4)

In general formula (4) given above, $R^{17}$ represents a hydrogen atom, an alkyl group having 1 to 10 carbon atoms, an alkenyl group having 2 to 10 carbon atoms, or an aryl group having 6 to 16 carbon atoms. $R^{18}$ represents a hydrogen atom, an alkyl group having 1 to 6 carbon atoms, an acyl group having 2 to 6 carbon atoms, or an aryl group having 6 to 16 carbon atoms. Here, m is an integer of 0 to 3. When m is 2 or more, the plurality of $R^{17}$ groups may be identical to or different from each other. When m is 2 or less, the plurality of $R^{18}$ groups may be identical to or different from each other.

Specific examples of the organosilanes represented by general formula (4) include tetrafunctional silanes such as tetramethoxysilane, tetraethoxysilane, tetraacetoxysilane, and tetraphenoxysilane; trifunctional silanes such as methyl trimethoxysilane, methyl triethoxysilane, methyl triisopropoxysilane, methyl tri-n-butoxysilane, ethyl trimethoxysilane, ethyl triethoxysilane, ethyl triisopropoxysilane, ethyl tri-n-butoxysilane, n-propyl trimethoxysilane, n-propyl triethoxysilane, n-butyl trimethoxysilane, n-butyl triethoxysilane, n-hexyl trimethoxysilane, n-hexyl triethoxysilane, decyl trimethoxysilane, vinyl trimethoxysilane, vinyl triethoxysilane, 3-methacryloyloxy propyl trimethoxysilane, 3-methacryloyloxy propyl triethoxysilane, 3-acryloxy propyl trimethoxysilane, phenyl trimethoxysilane, phenyl triethoxysilane, p-hydroxyphenyl trimethoxysilane, 1-(p-hydroxyphenyl) ethyl trimethoxysilane, 2-(p-hydroxyphenyl) ethyl trimethoxysilane, 4-hydroxy-5-(p-hydroxyphenyl carbonyloxy) pentyl trimethoxysilane, trifluoromethyl trimethoxysilane, trifluoromethyl triethoxysilane, 3,3,3-trifluoropropyl trimethoxysilane, 3-aminopropyl trimethoxysilane, 3-aminopropyl triethoxysilane, 3-glycidoxy propyl trimethoxysilane, 3-glycidoxypropyl triethoxysilane, 2-(3,4-epoxycyclohexyl) ethyl trimethoxysilane, 2-(3,4-epoxy cyclohexyl) ethyl triethoxysilane, [(3-ethyl-3-oxetanyl) methoxy]propyl trimethoxysilane, [(3-ethyl-3-oxetanyl) methoxy]propyl triethoxysilane, 3-mercaptopropyl trimethoxysilane, 3-trimethoxysilyl propyl succinate, 1-naphthyl trimethoxysilane, 1-naphthyl triethoxysilane, 1-naphthyl tri-n-propoxysilane, 2-naphthyl trimethoxysilane, 1-anthracenyl trimethoxysilane, 9-anthracenyl trimethoxysilane, 9-phenanthrenyl trimethoxysilane, 9-fluorenyl trimethoxysilane, 2-fluorenyl trimethoxysilane, 1-pyrenyl trimethoxysilane, 2-indenyl trimethoxysilane, and 5-acenaphthenyl trimethoxysilane; difunctional silanes such as dimethyl dimethoxysilane, dimethyl diethoxysilane, dimethyl diacetoxysilane, di-n-butyl dimethoxysilane, diphenyl dimethoxysilane, (3-glycidoxypropyl) methyl dimethoxysilane, (3-glycidoxypropyl) methyl diethoxysilane, di(1-naphthyl) dimethoxysilane, and di(1-naphthyl) diethoxysilane; and monofunctional silanes such as trimethyl methoxysilane, tri-n-butyl ethoxysilane, (3-glycidoxypropyl) dimethyl methoxysilane, and (3-glycidoxy propyl) dimethyl ethoxysilane. Two or more of these organosilanes may be used in combination.

Organosilanes as represented by general formula (5) that are useful as the alkali-soluble resin (a) are as defined below.

[Chemical compound 7]

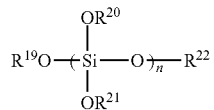

(5)

In general formula (5) given above, $R^{19}$ to $R^{22}$ each independently denote a hydrogen atom, an alkyl group having 1 to 6 carbon atoms, an acyl group having 2 to 6 carbon atoms, or an aryl group having 6 to 16 carbon atoms. Here, n denotes a real number in the range of 2 to 8. When n is 2 or more, the plurality of $R^{2o}$ and $R^{21}$ groups may be identical to or different from each other.

Specific examples of organosilanes as represented by general formula (5) include Methyl Silicate 51 ($R^{19}$ to $R^{22}$: methyl group, n: 4 on average) manufactured by Fuso Chemical Co., Ltd., M Silicate 51 ($R^{19}$ to $R^{22}$: methyl group, n: 3 to 5 on average), Silicate 40 ($R^{19}$ to $R^{22}$: ethyl group, n: 4 to 6 on average), Silicate 45 ($R^{19}$ to $R^{22}$: ethyl group, n: 6 to 8 on average) manufactured by Tama Chemicals Co., Ltd., Methyl Silicate 51 ($R^{19}$ to $R^{22}$: methyl group, n: 4 on average), Methyl Silicate 53A ($R^{19}$ to $R^{22}$: methyl group, n: 7 on average), and Ethyl Silicate 40 ($R^{19}$ to $R^{22}$: ethyl group, n: 5 on average) manufactured by Colcoat Co., Ltd. Two or more of these may be used in combination.

The content of Si atoms originating from an organosilane as represented by general formula (4) or general formula (5) in a polysiloxane can be determined by identifying the structure of the original organosilane by $^1$H-NMR, $^{13}$C-NMR, $^{29}$Si-NMR, IR, TOF-MS, etc., and calculating the ratio between the integrated value of the peak attributed to the Si—C bond and that attributed to the Si—O bond in an IR spectrum.

There are no specific limitations on the weight average molecular weight (Mw) of the polysiloxane, but the polystyrene based value is preferably 1,000 or more as determined by GPC (gel permeation chromatography) to ensure improved coatability. From the viewpoint of solubility in developers, on the other hand, the content is preferably 100,000 or less, more preferably 50,000 or less.

A polysiloxane to be used for the present invention can be synthesized through hydrolysis and partial condensation of monomers such as organosilanes as represented by general formula (3) or (4). Here, the partial condensation step is designed so that part of the Si—OH bonds in the hydrolysate will remain in the resulting polysiloxane, instead of complete condensation of the Si—OH bonds. Generally known methods can be used for the hydrolysis and partial condensation. A good method, for example, is to add a solvent and water, plus a catalyst if necessary, to an organosilane mixture and heating at 50° C. to 150° C. for about 0.5 to 100 hours while stirring. During the stirring, hydrolysis by-products (alcohols such as methanol) and condensation by-products (water) may be evaporated by distillation if necessary.

There are no specific limitations on the catalyst, but preferred ones include acid catalysts and basic catalysts. Specific examples of the acid catalysts include hydrochloric acid, nitric acid, sulfuric acid, hydrofluoric acid, phosphoric acid, acetic acid, trifluoroacetic acid, formic acid, multivalent carboxylic acids, anhydrides thereof, and ion exchange resins. Specific examples of the basic catalysts include triethyl amine, tripropyl amine, tributyl amine, tripentyl amine, trihexyl amine, triheptyl amine, trioctyl amine, diethyl amine, triethanol amine, diethanol amine, sodium hydroxide, potassium hydroxide, alkoxysilanes having amino groups, and ion exchange resins.

From the viewpoint of storage stability of the photosensitive resin composition, the polysiloxane solution obtained after the hydrolysis and partial condensations steps is preferably free of these catalysts, and therefore the catalysts may preferably be removed as required. There are no specific limitations on the removal method, but rinsing with water and/or treatment with ion exchange resin are preferred from the viewpoint of simple operation and removal performance. In a rinsing step, the polysiloxane solution is diluted with an appropriate hydrophobic solvent and then rinsed with water a few times, followed by condensing the resulting organic layer by using, for example, an evaporator. The above treatment with an ion exchange resin is designed for bringing the polysiloxane solution into contact with an appropriate ion exchange resin.

The photosensitive resin composition used in the cured film according to the present invention contains a photoacid generating agent (b). A photoacid generating agent (b) is a compound that generates an acid when exposed to light. Examples of the photoacid generating agent (b) include quinone diazide compounds, sulfonium salts, phosphonium salts, diazonium salts, and iodonium salts.

The quinone diazide compounds include those in the form of a sulfonic acid of quinonediazide ester-bonded in a polyhydroxy compound or a polyamino compound, those in the form of a sulfonic acid of quinonediazide sulfonamide-bonded to a polyhydroxy compound, and those in the form of a sulfonic acid of quinonediazide ester-bonded and/or sulfoneamide-bonded to a polyhydroxypolyamino compound. Of these, naphthoquinone diazide sulfonyl ester compounds are preferable and 4-naphthoquinone diazide sulfonyl ester compounds are particularly preferable. It is preferable that 50 mol % or more of the functional groups in the polyhydroxy compounds and polyamino compounds be substituted by quinone diazide. The use of a quinone diazide compound substituted to 50 mol % or more ensures a decrease in the affinity of the quinone diazide compound with an aqueous alkali solution, a large decrease in the solubility of the unexposed region of the resin composition in the aqueous alkali solution, and conversion of the quinone diazide sulfonyl group to an indene carboxylic acid under light irradiation, which leads to a large dissolution rate of the exposed region of the resin composition in the aqueous alkali solution. As a result, the ratio in dissolution rate between the exposed region and the unexposed region of the composition increases to enable the formation of a pattern with a high resolution. The use of such a quinone diazide compound enables the production of a positive type photosensitive resin composition that is photosensitive to the i-line (365 nm), h-line (405 nm), and g-line (436 nm) of a common mercury lamp.

Here, 4-naphthoquinone diazide sulfonyl ester compounds are absorptive to light in the i-line region of mercury lamps and suitable for i-line exposure, whereas 5-naphthoquinone diazide sulfonyl ester compounds are absorptive to light in a wider region including the g-line of mercury lamps and suitable for g-line exposure. Both 4-naphthoquinone diazide sulfonyl ester compounds and 5-naphthoquinone diazide sulfonyl ester compounds can serve effectively for the present invention, but it is desirable that a suitable 4-naphthoquinone diazide sulfonyl ester compound or 5-naphthoquinone diazide sulfonyl ester compound be selected to suite the wavelength used for exposure. Furthermore, it is possible to produce a naphthoquinone diazide sulfonyl ester compound that containing both a 4-naphthoquinone diazide sulfonyl group and a 5-naphthoquinone diazide sulfonyl group in one molecule, or it may also be effective to use a mixture of a 4-naphthoquinone diazide sulfonyl ester compound and a 5-naphthoquinone diazide sulfonyl ester compound.

When using a 4-naphthoquinone diazide sulfonyl ester compound, in particular, the o-quinone diazide compound is decomposed in the heat treatment step and part of the molecules are removed out of the film after being converted into sulfur dioxide or carbon dioxide, thus serving to reduce the acidic gas generation from the cured film. As a result, the shrinkage of pixels caused by acidic gases is further depressed and accordingly, this compound is particularly preferred.

It is preferable for the photoacid generating agent (b) to account for 1 part by mass or more, more preferably 3 parts by mass or more, and 40 parts by mass or less, more preferably 30 parts by mass or less, relative to 100 parts by mass of the alkali-soluble resin (a). Pattern formation can be performed with high sensitivity when the quantity is 1 part by mass or more, whereas the shrinkage of pixels caused by acidic gases from the o-quinone diazide compound can be depressed to enable the production of an organic EL device with improved long-term reliability when it is 40 parts by mass or less.

The photosensitive resin composition used for the cured film according to the present invention contains at least one compound (c) selected from the group consisting of cyclic amides, cyclic ureas, and derivatives thereof. It is considered that if at least one compound (c) selected from the group consisting of cyclic amides, cyclic ureas, and derivatives thereof is contained, the compound (c) works as a quencher for acidic gases to serve to prevent a decrease in light emission luminance or shrinkage of pixels and provide an organic EL device having high long-term reliability.

Such at least one compound (c) selected from the group consisting of cyclic amides, cyclic ureas, and derivatives thereof preferably has a structure as represented by general formula (1) given below and two or more such compounds may be contained together.

[Chemical compound 8]

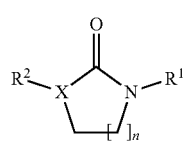

(1)

(In general formula (1), n denotes an integer of 1 to 4, and X denotes CH or a nitrogen atom. $R^1$ and $R^2$ each independently represent a hydrogen atom or an organic group having 1 to 20 carbon atoms. However, $R^1$ is an organic group containing 2 to 20 carbon atoms when X is CH, and it is a hydrogen atom or an organic group containing 1 to 20 carbon atoms when X is a nitrogen atom. $R^2$ is a hydrogen atom when X is CH, and it is a hydrogen atom or an organic group containing 1 to 20 carbon atoms when X is a nitrogen atom.)

The at least one compound (c) selected from the group consisting of cyclic amides, cyclic ureas, and derivatives thereof preferably has a boiling point of 210° C. or more to ensure easy persistence in the film after the heat treatment. The boiling point is preferably 400° C. or less from the viewpoint of reducing uneven coating. If the boiling point cannot be measured under atmospheric pressure, a measured value can be converted to the boiling point at atmospheric pressure using a boiling point conversion table.

Specific examples of the cyclic amides, cyclic ureas, and derivatives thereof include 2-pyrrolidone, N-methyl-2-pyrrolidone, N-ethyl-2-pyrrolidone, N-propyl-2-pyrrolidone, N-isopropyl-2-pyrrolidone, N-butyl-2-pyrrolidone, N-(t-butyl)-2-pyrrolidone, N-pentyl-2-pyrrolidone, N-cyclohexyl-2-pyrrolidone, N-methoxypropyl-2-pyrrolidone, N-ethoxyethyl-2-pyrrolidone, N-methoxybutyl-2-pyrrolidone, N-(2-hydroxyethyl)-2-pyrrolidone, N-phenyl-2-pyrrolidone, N-vinyl-2-pyrrolidone, N,N'-dimethylpropylene urea, 2-imidazolidinone, 1,3-dimethyl-2-imidazolidinone, 2-piperidone, and E-caprolactam. Of these, N-cyclohexyl-2-pyrrolidone (boiling point 154° C. at 7 mmHg, converted boiling point at atmospheric pressure 305° C.), N-(2-hydroxyethyl)-2-pyrrolidone (boiling point 175° C. at 10 mmHg, converted boiling point at atmospheric pressure 313° C.) are preferred because they are high enough in boiling point to remain more easily in the film after the heat treatment.

The total quantity of the at least one compound (c) selected from the group consisting of cyclic amides, cyclic ureas, and derivatives thereof accounts for 0.005 mass % or more and 5 mass % or less in 100 parts by mass of the alkali-soluble resin (a). In the photosensitive resin composition used to form the cured film, the quantity of the compound (c) preferably accounts for 0.1 part by mass or more, more preferably 1 parts by mass or more, and preferably 15 parts by mass or less, more preferably 10 parts by mass or less, relative to 100 parts by mass of the alkali-soluble resin (a). A good organic EL device with an increased long-term reliability can be produced if the compound (c) accounts for 0.1 part by mass or more, whereas pattern formation can be performed with high sensitivity if it accounts for 15 parts by mass or less.

The photosensitive resin composition used to form the cured film according to the present invention contains a thermal crosslinking agent (d) that contains an epoxy compound, oxetanyl compound, isocyanate compound, acidic group-containing alkoxymethyl compound, and/or acidic group-containing methylol compound. A thermal crosslinking agent is a compound that contains, in one molecule, at least two heat-reactive functional groups such as alkoxymethyl groups, methylol groups, epoxy groups, and oxetanyl groups.

The thermal crosslinking agent (d) that contains an epoxy compound, oxetanyl compound, isocyanate compound, acidic group-containing alkoxymethyl compound, and/or acidic group-containing methylol compound is preferred because it is so high in heat resistance as to permit reduction in outgassing from the cured film and production of an organic EL device with an increased long-term reliability.

Of the various materials for the thermal crosslinking agent, the use of an acidic group-containing alkoxymethyl compound or an acidic group-containing methylol compound is particularly preferable. The existence of an acidic group allows the at least one compound (c) selected from the group consisting of cyclic amides, cyclic ureas, and derivatives thereof to remain easily in the film after the heat treatment step to permit the production of an organic EL device with higher long-term reliability. Examples of the acidic group include carboxy groups, phenolic hydroxyl groups, sulfonic acid groups, and thiol groups, of which phenolic hydroxyl groups are preferred.

Preferred examples of the epoxy compounds include, for example, Epolite 40E, Epolite 100E, Epolite 200E, Epolite 400E, Epolite 70P, Epolite 200P, Epolite 400P, Epolite 1500NP, Epolite 80MF, Epolite 4000, Epolite 3002 (all manufactured by Kyoeisha Chemical Co., Ltd.), Denacol EX-212L, Denacol EX-214L, Denacol EX-216L, Denacol EX-850L (all manufactured by Nagase ChemteX Corporation), Epikote 828 (manufactured by Japan Epoxy Resins Co., Ltd.), and NC3000 (manufactured by Nippon Kayaku Co., Ltd.).

Preferred examples of the oxetanyl compounds include Eternacoll EHO, Eternacoll OXBP, Eternacoll OXTP, Eternacoll OXMA (all manufactured by Ube Industries, Ltd.), and oxetanized phenol novolac.

Preferred examples of the isocyanate compounds include, for example, Desmodur BB1101/1, Desmodur BL3375 (both manufactured by Bayer MaterialScience Ltd.), and TPA-B80E (manufactured by Asahi Kasei Chemicals Corporation).

Preferred examples of the acidic group-containing alkoxymethyl compounds and acidic group-containing methylol compounds include, for example, DML-PC, DML-34X, DML-PTBP, DML-PCHP, DML-OCHP, DML-PFP, DML-PSBP, DML-POP, DML-MBOC, DML-MBPC, DML-MTrisPC, DML-BPC, DML-BisOC-P, TriML-P, TriML-35XL, TML-HQ, TML-BP, TML-pp-BPF, TML-BPA, TMOM-BP, HML-TPPHBA, HML-TPHAP, HMOM-TPPHBA, and HMOM-TPHAP (trade names, all manufactured by Honshu Chemical Industry Co Ltd.).

Useful materials for the thermal crosslinking agent (d) that contains an epoxy compound, oxetanyl compound, isocyanate compound, acidic group-containing alkoxymethyl compound, and/or acidic group-containing methylol compound may be used as a combination of two or more thereof.

The thermal crosslinking agent (d) that contains an epoxy compound, oxetanyl compound, isocyanate compound, acidic group-containing alkoxymethyl compound, and/or acidic group-containing methylol compound preferably accounts for 1 part by mass or more and 30 parts by mass or less relative to 100 parts by mass of the alkali-soluble resin (a). If the thermal crosslinking agent (d) accounts for 1 part by mass or more and 30 parts by mass or less, it ensures the formation of a calcined or cured film with increased chemical resistance and hardness, reduction in outgassing from the cured film, production of an organic EL display device with increased long-term reliability, and production of a photosensitive resin composition with high storage stability.

The photosensitive resin composition used in the cured film according to the present invention may contain a phenolic hydroxyl group-containing compound (f). The phenolic hydroxyl group-containing compound (f) adds to the alkali developability of the photosensitive resin composition and also serves to allow the at least one compound (c) selected from the group consisting of cyclic amides, cyclic ureas, and derivatives thereof to remain easily in the film.

Examples of the phenolic hydroxyl group-containing compounds (f) include, for instance, Bis-Z, BisOC-Z, BisOPP-Z, BisP-CP, Bis26X-Z, BisOTBP-Z, BisOCHP-Z, BisOCR-CP, BisP-MZ, BisP-EZ, Bis26X-CP, BisP-PZ, BisP-IPZ, BisCR-IPZ, BisOCP-IPZ, BisOIPP-CP, Bis26X-IPZ, BisOTBP-CP, TekP-4HBPA (tetrakis P-DO-BPA), TrisP-HAP, TrisP-PA, TrisP-PHBA, TrisP-SA, TrisOCR-PA, BisOFP-Z, BisRS-2P, BisPG-26X, BisRS-3P, BisOC-OCHP, BisPC-OCHP, Bis25X-OCHP, Bis26X-OCHP, BisOCHP-OC, Bis236T-OCHP, methylene-tris-FR-CR, BisRS-26X, BisRS-OCHP, (trade names, all manufactured by Honshu Chemical Industry Co., Ltd.), BIR-OC, BIP-PC, BIR-PC, BIR-PTBP, BIR-PCHP, BIP-BIOC-F, 4PC, BIR-BIPC-F, TEP-BIP-A (trade names, all manufactured by Asahi Organic Chemicals Industry Co., Ltd.), 1,4-dihydroxy naphthalene, 1,5-dihydroxy naphthalene, 1,6-dihydroxy naphthalene, 1,7-dihydroxy naphthalene, 2,3-dihydroxy naphthalene, 2,6-dihydroxy naphthalene, 2,7-dihydroxy naphthalene, 2,4-dihydroxy quinoline, 2,6-dihydroxy quinoline, 2,3-dihydroxy quinoxaline, anthracene-1,2,10-triol, anthracene-1,8,9-triol, and 8-quinolinol.

Such a phenolic hydroxyl group-containing compound (f) preferably accounts for 1 part by mass or more and 30 parts by mass or less relative to 100 parts by mass of the alkali-soluble resin (a).

The photosensitive resin composition used in the cured film according to the present invention may contain an organic solvent (e). This allows the photosensitive resin composition to be in a varnish-like state, ensuring improved coatability.

Useful examples of the organic solvent (e) include, for example, polar aprotic solvents such as γ-butyrolactone; ethers such as ethylene glycol monomethyl ether, ethylene glycol monoethyl ether, ethylene glycol mono-n-propyl ether, ethylene glycol mono-n-butyl ether, diethylene glycol monomethyl ether, diethylene glycol monoethyl ether, diethylene glycol mono-n-propyl ether, diethylene glycol mono-n-butyl ether, triethylene glycol monomethyl ether, triethylene glycol monoethyl ether, propylene glycol monomethyl ether, propylene glycol monoethyl ether, propylene glycol mono-n-propyl ether, propylene glycol mono-n-butyl ether, dipropylene glycol monomethyl ether, dipropylene glycol monoethyl ether, dipropylene glycol mono-n-propyl ether, dipropylene glycol mono-n-butyl ether, tripropylene glycol monomethyl ether, tripropylene glycol monoethyl ether, tetrahydrofuran, and dioxane; ketones such as acetone, methyl ethyl ketone, diisobutyl ketone, cyclohexanone, 2-heptanone, 3-heptanone, and diacetone alcohol; esters such as ethylene glycol monomethyl ether acetate, ethylene glycol monoethyl ether acetate, diethylene glycol monomethyl ether acetate, diethylene glycol monoethyl ether acetate, propylene glycol monomethyl ether acetate, propylene glycol monoethyl ether acetate, and ethyl lactate; other esters such as ethyl 2-hydroxy-2-methylpropionate, methyl 3-methoxypropionate, ethyl 3-methoxypropionate, methyl 3-ethoxypropionate, ethyl 3-ethoxypropionate, ethyl ethoxyacetate, ethyl hydroxyacetate, methyl 2-hydroxy-3-phenylbutanoate, 3-methoxybutyl acetate, 3-methyl-3-methoxybutyl acetate, 3-methyl-3-methoxybutylpropionate, ethyl acetate, n-propyl acetate, i-propyl acetate, n-butyl acetate, i-butyl acetate, n-pentyl formate, i-pentyl acetate, n-butyl propionate, ethyl butyrate, n-propyl butyrate, i-propyl butyrate, n-butyl butyrate, methyl pyruvate, ethyl pyruvate, n-propyl pyruvate, methyl acetoacetate, ethyl acetoacetate, and ethyl 2-oxobutanoate; and aromatic hydrocarbons such as toluene and xylene; which may be used singly or as a mixture thereof.

There are no specific limitations on the quantity of the organic solvent (e), but it preferably accounts for 100 to 3,000 parts by mass, more preferably 300 to 2,000 parts by mass, relative to 100 parts by mass of the alkali-soluble resin (a). There are no specific limitations on the boiling point of the organic solvent (e), but it is preferable for part of the components of the organic solvent (e) to have a boiling point of 180° C. or more. Relative to the total quantity of the organic solvent (e), the solvent components having a boiling point of 180° C. or more account for 30 parts by mass or less, preferably 20 parts by mass or less, and more preferably 10 parts by mass or less. If the solvent components having a boiling point of 180° C. or more account for 30 parts by mass or less, it serves to reduce the outgassing from planarizing layers or insulation layers in the heat-cured film, resulting in an organic EL device with an increased long-term reliability.

The photosensitive resin composition used in the cured film according to the present invention may contain an adhesion improving agent. Examples of the adhesion improving agent include silane coupling agents such as vinyl trimethoxysilane, vinyl triethoxysilane, epoxy cyclohexylethyl trimethoxysilane, 3-glycidoxypropyl trimethoxysilane, 3-glycidoxypropyl triethoxysilane, p-styryl trimethoxysilane, 3-aminopropyl trimethoxysilane, 3-aminopropyl triethoxysilane, and N-phenyl-3-aminopropyl trimethoxysilane, and others such as titanium chelating agent, aluminum chelating agent, and those compound resulting from a reaction between an aromatic amine compound and an alkoxy group-containing silicon compound. Two or more of these may be contained together. If these adhesion improving agents are contained, a photosensitive resin film in a development step, for example, can achieve stronger adhesion to a substrate material such as silicon wafer, ITO, $SiO_2$, and nitride silicon. They also serve to improve the resistance to oxygen plasma used for cleaning and to UV ozone processing. The content of the adhesion improving agent is preferably 0.01 to 15 parts by mass relative to 100 parts by mass of the alkali-soluble resin (a).

The photosensitive resin composition used in the cured film according to the present invention may contain a surface active agent to ensure improved wetting of the substrate.

Examples of the surface active agent include fluorine-based surface active agents such as Fluorad (trade name, manufactured by Sumitomo 3M), Megafac (trade name, manufactured by DIC Corporation), and Surflon (trade name, manufactured by Asahi Glass Co., Ltd.); organic siloxane surface active agents such as KP341 (trade name, manufactured by Shin-Etsu Chemical Co., Ltd.), DBE (trade name, manufactured by Chisso Corporation), Glanol (trade name, manufactured by Kyoeisha Chemical Co., Ltd.), and BYK (manufactured by BYK-Chemie); and acrylic polymer surface active agents such as Polyflow (trade name, manufactured by Kyoeisha Chemical Co., Ltd.).

Described in detail below is the method for producing the cured film according to the present invention from a photosensitive resin composition. The photosensitive resin composition is spread by the spin coating technique, slit coating technique, dip coating technique, spray coating technique, printing technique, etc., to form a coating film of the photosensitive resin composition. Before the coating step, the base to be coated with the photosensitive resin composition may be pre-treated with an adhesion improving agent as described above. For example, an adhesion improving agent may be dissolved in a solvent such as isopropanol, ethanol, methanol, water, tetrahydrofuran, propylene glycol monomethyl ether acetate, propylene glycol monomethyl ether, ethyl lactate, and diethyl adipate to a content of 0.5 to 20 parts by mass, and the resulting solution is then used to treat the surface of the base. The treatment of the surface of the base may be carried out by such a technique as spin coating, slit die coating, bar coating, dip coating, spray coating, and steam treatment. After the photosensitive resin composition spreading step, vacuum drying is carried out if necessary, followed by heat-treatment in the range of 50° C. to 180° C. for 1 minute to several hours using a hot plate, oven, infrared ray, etc., to produce a photosensitive resin film.

Described below is the method for forming a pattern from the resulting photosensitive resin film. An actinic ray is applied to the photosensitive resin film through a mask having an intended pattern. Actinic rays available for light exposure include ultraviolet ray, visible light, electron beam, and X-ray, but the i-line (365 nm), h-line (405 nm), and g-line (436 nm) of mercury lamps are preferred for the invention.

After the light exposure step, the exposed region is removed using a developing solution. Preferable developers include an aqueous solution of alkaline compounds such as tetramethyl ammonium hydroxide, diethanol amine, diethyl aminoethanol, sodium hydroxide, potassium hydroxide, sodium carbonate, potassium carbonate, triethyl amine, diethyl amine, methyl amine, dimethyl amine, dimethylaminoethyl acetate, dimethylaminoethanol, dimethylaminoethyl methacrylate, cyclohexyl amine, ethylene diamine, and hexamethylene diamine. In some cases, such an aqueous alkali solution may contain polar solvents such as N-methyl-2-pyrrolidone, N,N-dimethylformamide, N,N-dimethylacetamide, dimethyl sulfoxide, γ-butyrolactone, and dimethylacrylamide; alcohols such as methanol, ethanol, and isopropanol; esters such as ethyl lactate and propylene glycol monomethyl ether acetate; and ketones such as cyclopentanone, cyclohexanone, isobutyl ketone, and methyl isobutyl ketone; which may be added singly or together with several others selected therefrom. The available development techniques include spraying, paddling, immersion, and ultrasonic vibration.

The pattern formed by development is preferably rinsed with distilled water. Here again, the distilled water used for rinsing may contain an alcohol such as ethanol and isopropyl alcohol, an ester such as ethyl lactate and propylene glycol monomethyl ether acetate, or the like.

Next, heat treatment is carried out to produce a cured film. This heat treatment works to remove the residual solvent and components with low heat resistance, thus serving to produce a cured film with improved heat resistance, chemical resistance, and reliability. In particular, when the photosensitive resin composition used to form the cured film according to the present invention contains an alkali-soluble resin selected from polyimide precursors and polybenzoxazole precursors, a copolymer thereof, or a copolymer of one thereof with an polyimide, imide rings or oxazole rings can be formed by heat treatment to ensure improvement in heat resistance, chemical resistance, and reliability. If the thermal crosslinking agent contained is a compound having at least two selected from alkoxy methyl groups, methylol groups, epoxy groups, and oxetanyl groups, thermal crosslinking reaction can be caused by heat treatment to ensure improvement in heat resistance, chemical resistance, and reliability. This heat treatment is performed for 5 minutes to 5 hours by stepwise heating at selected temperatures or continuous heating-up over a certain selected temperature range. For example, heat treatment may be performed at 150° C. and 250° C. for 30 minutes each. Or, heating may be performed for 2 hours while linearly increasing the temperature from room temperature to 300° C. For the present invention, heat treatment is performed preferably at 150° C. to 400° C., more preferably at 200° C. or more and 350° C. or less, and still more preferably at 220° C. or more and 300° C. or less.

The cured film according to the present invention can be used in an organic EL display device. More specifically, it is used suitably as material for planarizing films and insulation layers in organic EL display elements. In such cases, the area of the openings in an insulation layer per unit area is called the insulation layer opening rate. The cured film according to the present invention can serve more effectively in an organic EL display device with a low insulation layer opening rate to achieve high-definition displaying characteristics. This is because the shrinkage of pixels, which can cause problems, spreads from edges of the pixels. More specifically, in an organic EL device, it is preferable for the organic EL display element to have an insulation layer opening rate of 20% or less in the display area from the viewpoint of enhancing the advantageous effects of the invention.

The cured film according to the present invention can be used in electronic components such as semiconductor devices and multi-layered circuit boards. More specifically, the cured film according to the present invention is used suitably in semiconductor electronic components, semiconductor devices, etc., to serve as material for semiconductor's passivation film, semiconductor element's protection film, interlaminar insulation film in high-density multi-layered wiring, or interlaminar insulation film between redistribution layers. Electronic devices using the cured film according to the present invention as surface protection film, interlaminar insulation film, etc., include, for example, MRAMs with low heat resistance. This means that the cured film according to the present invention is suitable as material for the surface protection film in MRAMs. In addition to MRAMs, so-called polymer memories (polymer ferroelectric RAM: PFRAM) and phase change memories (phase change RAM: PCRAM, ovonics unified memory: OUM), which are highly expected as next generation memories, will likely adopt novel materials that are lower in heat resistance than conventional memories. Thus, the cured film according to the present invention is also suitable as material for their surface protection film.

Next, the second embodiment is described in detail.

The positive type photosensitive resin composition according to the present invention includes an alkali-soluble resin (a), a photoacid generating agent (b), at least one compound (c) selected from the group consisting of cyclic amides, cyclic ureas, and derivatives thereof, a thermal crosslinking agent (d), and an organic solvent (e), the thermal crosslinking agent (d) containing an epoxy compound, oxetanyl compound, isocyanate compound, acidic group-containing alkoxymethyl compound, and/or acidic group-containing methylol compound, the compound (c) accounting for 0.1 part by mass or more and 15 parts by mass or less relative to 100 parts by mass of the alkali-soluble resin (a), and the organic solvent (e) accounting for 100 to 3,000 parts by mass relative thereto. Each of the components is described below.

The alkali-soluble resin (a), a photoacid generating agent (b), at least one compound (c) selected from the group consisting of cyclic amides, cyclic ureas, and derivatives thereof, a thermal crosslinking agent (d), and an organic solvent (e) may be those cited as examples of the alkali-soluble resin (a), a photoacid generating agent (b), at least one compound (c) selected from the group consisting of cyclic amides, cyclic ureas, and derivatives thereof, a thermal crosslinking agent (d), and an organic solvent (e) to use for the cured film according to the first embodiment.

It is preferable for the photoacid generating agent (b) to account for 1 part by mass or more, more preferably 3 parts by mass or more, and 40 parts by mass or less, more preferably 30 parts by mass or less, relative to 100 parts by mass of the alkali-soluble resin (a). Pattern formation can be performed with high sensitivity when the quantity is 1 part by mass or more, whereas the shrinkage of pixels caused by acidic gases from the o-quinone diazide compound can be depressed to enable the production of an organic EL device with improved long-term reliability when it is 40 parts by mass or less.

The at least one compound (c) selected from the group consisting of cyclic amides, cyclic ureas, and derivatives thereof preferably accounts for 0.1 part by mass or more, more preferably 1 part by mass or more, and preferably 15 parts by mass or less, more preferably 10 parts by mass or less, relative to 100 parts by mass of the alkali-soluble resin (a). A good organic EL device with an increased long-term reliability can be produced if it accounts for 0.1 part by mass or more, whereas pattern formation can be performed with high sensitivity if it accounts for 15 parts by mass or less.

The thermal crosslinking agent (d) that contains an epoxy compound, oxetanyl compound, isocyanate compound, acidic group-containing alkoxymethyl compound, and/or acidic group-containing methylol compound preferably accounts for 1 part by mass or more and 30 parts by mass or less relative to 100 parts by mass of the alkali-soluble resin (a). If the thermal crosslinking agent accounts for 1 part by mass or more and 30 parts by mass or less, it ensures the formation of a calcined or cured film with increased chemical resistance and hardness, reduction in outgassing from the cured film, production of an organic EL display device with increased long-term reliability, and production of a photosensitive resin composition with high storage stability.

The photosensitive resin composition according to the present invention may contain a phenolic hydroxyl group-containing compound (f). The phenolic hydroxyl group-containing compound (f) adds to the alkali developability of the positive type photosensitive resin composition and also serves to allow the at least one compound (c) selected from the group consisting of cyclic amides, cyclic ureas, and derivatives thereof to remain easily in the film. The phenolic hydroxyl group-containing compound (f) may be one cited as an example of the phenolic hydroxyl group-containing compound (f) to use for the first embodiment.

Such a phenolic hydroxyl group-containing compound (f) preferably accounts for 1 part by mass or more and 30 parts by mass or less relative to 100 parts by mass of the alkali-soluble resin (a).

The positive type photosensitive resin composition according to the present invention contains an organic solvent (e). This allows the positive type photosensitive resin composition to be in a varnish-like state, ensuring improved coatability. The organic solvent (e) may be one cited as an example of the organic solvent (e) to use for the first embodiment.

The organic solvent (e) accounts for 100 to 3,000 parts by mass, preferably 300 to 2,000 parts by mass, relative to 100 parts by mass of the alkali-soluble resin (a). Furthermore, relative to the total quantity of the organic solvent (e), the solvent components having a boiling point of 180° C. or more account for 30 parts by mass or less, preferably 20 parts by mass or less, and more preferably 10 parts by mass or less. If the solvent components having a boiling point of 180° C. or more account for 30 parts by mass or less, it serves to reduce the outgassing from planarizing layers or insulation layers in the heat-cured film, resulting in an organic EL device with an increased long-term reliability.

The photosensitive resin composition according to the present invention may contain an adhesion improving agent. The adhesion improving agent may be one cited as an example of the adhesion improving agent to use for the first embodiment. The adhesion improving agent preferably accounts for 0.01 to 15 parts by mass relative to 100 parts by mass of the alkali-soluble resin (a).

The photosensitive resin composition according to the present invention may contain a surface active agent to ensure efficient wetting of the substrate. The surface active agent may be one cited as an example of the surface active agent to use for the first embodiment.

The method to use for producing a cured film from the photosensitive resin composition according to the present invention may be one cited as an example of the cured film production method to use for the first embodiment.

EXAMPLES

The present invention will be illustrated below in greater detail with reference to Examples, but it should be understood that the invention is not construed as being limited thereto. The evaluations of positive type photosensitive resin composition samples described in Examples are carried out by the following methods.

(1) Preparation of Developed Film for Sensitivity Evaluation

A varnish sample was spread over an 8-inch silicon wafer by the spin coating technique using a coating and developing apparatus (Mark-7, manufactured by Tokyo Electron Ltd.) and baked on a hot plate at 120° C. for 3 minutes to prepare a prebaked film with a film thickness of 3.0 μm. Subsequently, using a light exposure machine (NSR-2005i9C i-line stepper, manufactured by Nicon Corporation), it was exposed to light through a mask having a 10 μm contact hole pattern to an exposure of 100 to 1200 mJ/cm$^2$ in steps of 50 mJ/cm$^2$. After the light exposure step, using the Mark-7 developing apparatus, it was developed with an aqueous solution containing 2.38 parts by mass of tetramethyl ammonium (hereinafter referred to as 2.38% TMAH, manufactured by Tama Chemicals Co., Ltd.) for a time period required for the film loss caused by development to reach 0.5 μm, followed by rinsing with distilled water and drying by shaking off water to provide a developed film having a pattern.

Method for Measurement of Film Thickness

Measurements were taken using Lambda Ace STM-602 manufactured by Dainippon Screen Mfg. Co., Ltd. assuming a refractive index of 1.63.

Calculation of Sensitivity

The pattern of the developed film obtained by the above procedure was observed by an FDP microscope (MX61, manufactured by Olympus Corporation) at a magnification of 20 times to determine the minimum exposure required to form contact holes with an opening diameter of 10 μm, which was assumed to represent the sensitivity.

Coatability Evaluation

The prebaked film prepared by the above procedure was observed visually under light from a sodium vapor lamp to determine the coatability. The observation was represented by ○ if the film was completely uniform, by Δ if a little uneven, or by × if uneven over the entire film.

(2) Calculation of Total Quantity of Compound (c) in Cured Film

A varnish sample was spread over an 8-inch silicon wafer by the spin coating technique using a coating and developing apparatus (Mark-7, manufactured by Tokyo Electron Ltd.) and baked on a hot plate at 120° C. for 3 minutes to prepare a prebaked film with a film thickness of 3.2 μm. After this, using the Mark-7 developing apparatus, it was developed with an aqueous solution containing 2.38 parts by mass of tetramethyl ammonium (hereinafter referred to as 2.38% TMAH, manufactured by Tama Chemicals Co., Ltd.) for a time period required for the film loss caused by development to reach 0.5 μm, followed by rinsing with distilled water, drying by shaking off water, and curing the developed solid film in a nitrogen atmosphere in an oven at a predetermined temperature for 60 minutes to provide a cured film.

The film thickness of the resulting cured film was measured, and a 1×5 cm portion was cut out and subjected to an adsorption and capture step using the purge and trap technique. More specifically, the cured film specimen taken above was heated at 400° C. for 60 minutes using helium as purge gas, and the desorbed components were captured in an adsorption pipe.

Using a thermal desorption apparatus, the captured components were subjected to thermal desorption under the primary desorption conditions of 260° C. for 15 minutes and the secondary adsorption and desorption conditions of −27° C. and 320° C. for 5 minutes, followed by GC-MS analysis using a GC-MS apparatus (7890/5975C, manufactured by Agilent) under the conditions of a column temperature of 40° C. to 300° C., use of helium as carrier gas (1.5 mL/min), and a scan range of m/Z 29 to 600. Each component of the compound (c) was subjected to GC-MS analysis under the same conditions as above to produce a calibration curve, and the quantity of gas generation was calculated.

The value obtained (μg) was divided by the area of 5 cm² to give a quotient in μg/cm². The quotient was divided by the product of the specific gravity of the alkali-soluble resin (a) and the film thickness and multiplied by 100 to calculate the total content of the compound (c) in the cured film.

(3) Long-Term Reliability Test of Organic EL Display Device

Production Method for Organic EL Display Device

FIG. 1 shows a schematic view of the substrate used. First, a 38×46 mm non-alkali glass substrate 1 was coated, by the spin coating technique, with a varnish sample containing the positive type photosensitive resin composition prepared in each Example as specified in Table 1, and then prebaked on a hot plate at 120° C. for 2 minutes. This film was subjected to UV light exposure through a photomask and developed with a 2.38% TMAH solution to dissolve only the light-exposed region, followed by rinsing with pure water. The resulting polyimide precursor pattern was cured in a nitrogen atmosphere in an oven at an predetermined temperature for 60 minutes. In this way, a planarizing layer 2 was formed only in a limited effective area of the substrate (FIG. 1(a)). The planarizing layer 2 had a thickness of about 2.0 μm. Then, a 100 nm APC alloy (Ag alloy) film was formed by the sputtering technique over the entire substrate and etched to serve as a reflecting electrode 3 (FIG. 1(b)). Subsequently, a 10 nm transparent electrically conductive film of indium tin oxide (ITO) was formed by the sputtering technique over the entire substrate and etched to serve as first electrode 4. In addition, an auxiliary electrode 5, which would serve to produce a second electrode 8, was formed simultaneously (FIG. 1(c)). The resulting substrate was subjected to ultrasonic cleaning for 10 minutes in Semico Clean 56 (trade name, manufactured by Furuuchi Chemical Corporation) and then washed with ultrapure water. In each Example, the entire surface of this substrate was coated, by the spin coating technique, with a varnish sample containing the positive type photosensitive resin composition prepared in each Example as specified in Table 1, and prebaked on a hot plate at 120° C. for 2 minutes. This film was subjected to UV light exposure through a photomask and developed with a 2.38% TMAH solution to dissolve only the light-exposed region, followed by rinsing with pure water. The resulting polyimide precursor pattern was cured in a nitrogen atmosphere in an oven at 250° C. for 60 minutes. In this way, an insulation layer 6 of photosensitivity polyimide having a structure in which openings each with a width of 70 μm and a length of 260 μm were aligned at intervals of 155 μm in the width direction and 465 μm in the length of direction, wherein each opening served to expose a first electrode 4, was formed only in an limited effective area of the substrate (FIG. 1(d)). These openings produced above will finally form light emitting pixels. The limited effective area of the substrate had a size of 16 mm×16 mm and the insulation layer 6 had a thickness of about 2.0 μm.

Then, an organic EL display device was produced using a substrate having a planarizing layer 2, a reflecting electrode 3, a first electrode 4, and an insulation layer 6 formed thereon. After carrying out nitrogen plasma treatment as pre-treatment, an organic EL layer 7 that included a light emitting layer was formed by the vacuum deposition technique (FIG. 1(e)). Here, the degree of vacuum used in the deposition step was $1 \times 10^{-3}$ Pa or less and the substrate was rotated relative to the deposition source during the deposition step. First, a compound (HT-1) was deposited to 10 nm to form a hole injection layer and a compound (HT-2) was deposited to 50 nm to form a hole transport layer. Subsequently, a compound (GH-1) and a compound (GD-1) were deposited as host material and dopant material, respectively, on the light emitting layer in such a manner as to achieve a doping concentration of 10 wt % and a thickness of 40 nm. Then, a 40 nm thick layer of compounds (ET-1) and (LiQ) combined at a volume ratio of 1:1, adopted as electron transport materials, was formed thereon. The structures of the compounds used in the organic EL layer 7 are shown blow.

[Chemical compound 9]

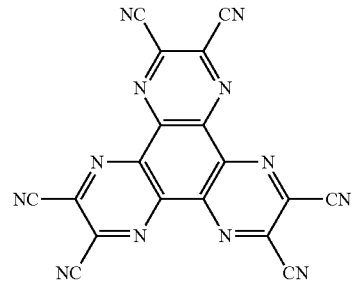

HT-1

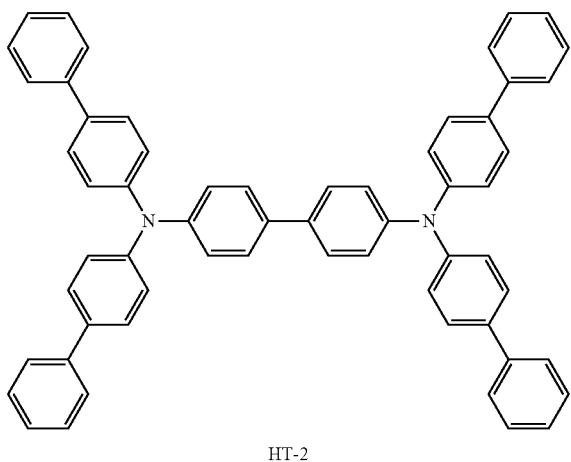

HT-2

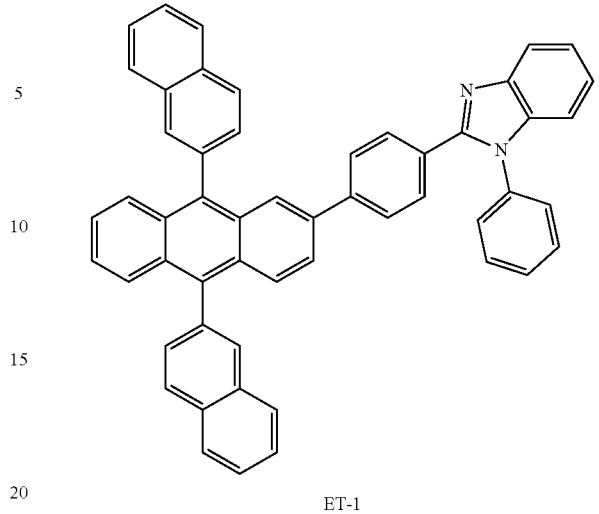

ET-1

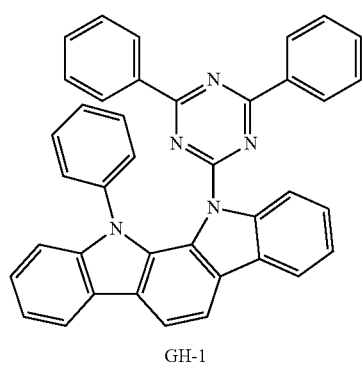

GH-1

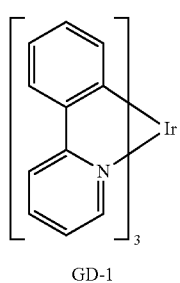

GD-1

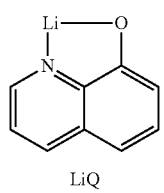

LiQ

Then, a compound (LiQ) was deposited to 2 nm and MgAg, mixed at a volume ratio of 10:1, was deposited to 10 nm to form a second electrode 8 (FIG. 1(*f*)). Finally, in a low-humidity nitrogen atmosphere, a cap-shaped glass plate was adhered with an epoxy resin based adhesive to achieve sealing, thus producing four 5 mm×5 mm light emitting devices on one substrate. The film thickness referred to herein is the reading on a crystal oscillation type film thickness monitor.

Long-Term Reliability Test of Organic EL Display Device

The organic EL display device produced above was placed, with the light emitting face up, on a hot plate heated at 80° C. and exposed to UV light with a wavelength of 365 nm at an illuminance of 0.6 mW/cm². After an elapsed time of 250 hours, 500 hours, 1000 hours, or 1500 hours, the device was driven for light emission by a direct current of 10 mA/cm² and the light emission area in light emitting pixels was measured.

Synthesis Example 1

Synthesis of Hydroxyl Group-Containing Diamine Compounds

First, 18.3 g (0.05 mole) of 2,2-bis(3-amino-4-hydroxyphenyl) hexafluoropropane (hereinafter referred to as BAHF) was dissolved in 100 mL of acetone and 17.4 g (0.3 mole) of propylene oxide, and cooled to −15° C. Then, a solution of 20.4 g (0.11 mole) of 3-nitrobenzoyl chloride dissolved in 100 mL of acetone was added dropwise. After the end of dropping, the solution was allowed to react at −15° C. for 4 hours, followed by allowing it to return to room temperature. The resulting white solid precipitate was separated out by filtration and vacuum-dried at 50° C.

A 30 g portion of the solid material was placed in a 300 mL stainless steel autoclave and dispersed in 250 mL of methyl cellosolve, followed by adding 2 g of 5% palladium-carbon. Then, a balloon was used to introduce hydrogen to cause a reduction reaction at room temperature. After about 2 hours, the reaction was finished after checking that the balloon would be deflated no more. After the end of the reaction, the solution was filtrated to remove the palladium compound used as catalyst and concentrated in a rotary evaporator to provide a hydroxyl group-containing diamine compound as represented by the formula given below.

[Chemical compound 10]

Synthesis Example 2

Synthesis of Alkali-Soluble Resin (A-1)

In a dry nitrogen flow, 31.0 g (0.10 mole) of 3, 3', 4, 4'-diphenyl ether tetracarboxylic dianhydride (hereinafter referred to as ODPA) was dissolved in 500 g of N-methyl-2-pyrrolidone (NMP). Here, 45.35 g (0.075 mole) of the hydroxyl group-containing diamine compound prepared in Synthesis example 1 and 1.24 g (0.005 mole) of 1,3-bis(3-aminopropyl) tetramethyl disiloxane were added together with 50 g of NMP, followed by performing reaction at 20° C. for 1 hour and additional reaction at 50° C. for 2 hours. Then, 4.36 g (0.04 mole) of 4-aminophenol, used as end-capping agent, was added together with 5 g of NMP, followed by performing reaction at 50° C. for 2 hours. Subsequently, a solution prepared by diluting 28.6 g (0.24 mole) of N,N-dimethylformamide dimethylacetal with 50 g of NMP was added dropwise over 10 minutes. After the dropping, stirring was performed at 50° C. for 3 hours. After the stirring, the solution was cooled to room temperature and then the solution was poured into 3 L of water to provide a white precipitate. This precipitate was collected by filtration, rinsed with water three times, and dried in a vacuum drying machine at 80° C. for 24 hours to provide a polyimide precursor, that is, the intended alkali-soluble resin (A-1).

Synthesis Example 3

Synthesis of Alkali-Soluble Resin (A-2)

In a dried nitrogen flow, 29.3 g (0.08 mole) of BAHF, 1.24 g (0.005 mole) of 1,3-bis(3-aminopropyl) tetramethyl disiloxane, and 3.27 g (0.03 mole) of 3-aminophenol, which was used as end capping agent, were dissolved in 150 g N-methyl-2-pyrrolidone (NMP). To this solution, 31.0 g (0.1 mole) of ODPA was added together with 50 g of NMP, stirred at 20° C. for 1 hour, and additionally stirred at 50° C. for 4 hours. Subsequently, 15 g of xylene was added and stirred at 150° C. for 5 hours while distilling water together with xylene. After the stirring, the solution was poured in 3 L of water and the resulting white precipitate was collected. This precipitate was collected by filtration, rinsed with water three times, and dried in a vacuum drying machine at 80° C. for 24 hours to provide a polyimide, that is, the alkali-soluble resin (A-2).

Synthesis Example 4

Synthesis of Alkali-Soluble Resin (A-3)

In a dry nitrogen flow, 18.3 g (0.05 mole) of BAHF was dissolved in 50 g of NMP and 26.4 g (0.3 mole) of glycidyl methyl ether, and the temperature of the solution was decreased to −15° C. Then a solution prepared by dissolving 7.4 g (0.025 mole) of diphenyl ether dicarboxylic acid dichloride (manufactured by Nihon Nohyaku Co., Ltd.) and 5.1 g (0.025 mole) of isophthalic acid chloride (manufactured by Tokyo Chemical Industry Co., Ltd.) in 25 g of γ-butyrolactone (GBL) was added dropwise while maintaining the internal temperature at or below 0° C. After the completion of the dropping step, stirring was continued at −15° C. for 6 hours. After the end of the reaction, the solution was poured in 3 L of water containing 10 parts by mass of methanol and the resulting white precipitate was collected. This precipitate was collected by filtration, rinsed with water three times, and dried in a vacuum drying machine at 80° C. for 24 hours to provide a polybenzoxazole precursor, that is, the intended alkali-soluble resin (A-3).

Synthesis Example 5

Synthesis of Alkali-Soluble Resin Solution (A-4)

In a 500 ml flask, 5 g of 2,2'-azobis(isobutyronitrile), 5 g of t-dodecane thiol, and 150 g of propylene glycol monomethyl ether acetate (hereinafter abbreviated as PGMEA) were fed. Subsequently, 30 g of methacrylic acid, 35 g of benzyl methacrylate, and 35 g of tricyclo[5.2.1.0$^{2,6}$]decane-8-yl methacrylate were added and stirred for a while at room temperature, followed by filling the flask with nitrogen and stirring while heating at 70° C. for 5 hours. Then, 15 g of glycidyl methacrylate, 1 g of dimethylbenzyl amine, and 0.2 g of p-methoxyphenol were add to the resulting solution, followed by stirring while heating at 90° C. for 4 hours to provide an acrylic resin solution (A-4). The resulting acrylic resin solution (A-4) had a solid content of 43 parts by mass.

Synthesis Example 6

Synthesis of Quinone Diazide Compound (B-1)

In a dry nitrogen flow, 21.22 g (0.05 mole) of TrisP-PA (trade name, manufactured by Honshu Chemical Industry Co., Ltd.) and 36.27 g (0.135 mole) of 5-naphthoquinone diazide sulfonyl acid chloride were dissolved in 450 g of 1,4-dioxane and maintained at room temperature. To this solution, a mixture of 15.18 g of triethyl amine with 50 g of 1,4-dioxane was added dropwise while maintaining the system below 35° C. After the dropping, stirring was performed at 30° C. for 2 hours. The triethylamine salt was filtered and the filtrate was poured in water. Then, the precipitate deposited was collected by filtration. The resulting precipitate was dried in a vacuum drying machine to provide a quinone diazide compound (B-1) as represented by the following formula.

[Chemical compound 11]

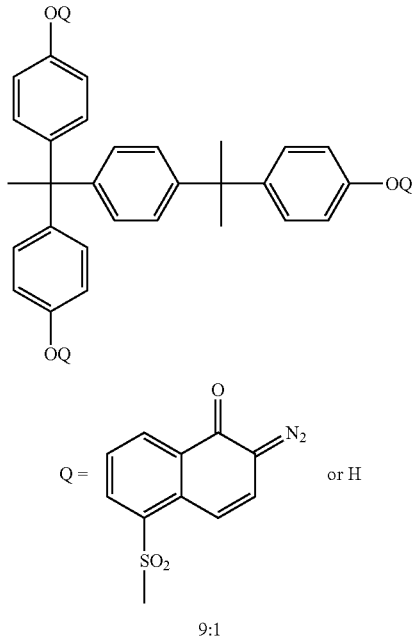

Synthesis Example 7

Synthesis of Quinone Diazide Compound (B-2)

In a dry nitrogen flow, 21.22 g (0.05 mole) of TrisP-PA (trade name, manufactured by Honshu Chemical Industry Co., Ltd.) and 36.27 g (0.135 mole) of 4-naphthoquinone diazide sulfonyl acid chloride were dissolved in 450 g of 1,4-dioxane and maintained at room temperature. To this solution, a mixture of 15.18 g of triethyl amine with 50 g of 1,4-dioxane was added dropwise while maintaining the system below 35° C. After the dropping, stirring was performed at 30° C. for 2 hours. The triethylamine salt was filtered and the filtrate was poured in water. Then, the precipitate deposited was collected by filtration. The resulting precipitate was dried in a vacuum drying machine to provide a quinone diazide compound (B-2) as represented by the following formula.

[Chemical compound 12]

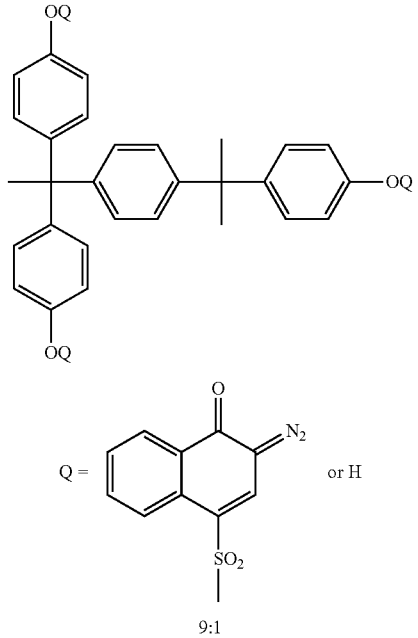

Reference Example 1

First, 10.0 g of the alkali-soluble resin (A-1) prepared in Synthesis example 2, 1.2 g of the quinone diazide compound (B-1) prepared in Synthesis example 6, 0.1 g of N,N-dimethyl formamide (C-1 in Tables), adopted as the at least one compound (c) selected from the group consisting of cyclic amides, cyclic ureas, and derivatives, 2 g of NC3000 (D-1 in Tables), adopted as the thermal crosslinking agent (d), were dissolved in 30.0 g of propylene glycol monomethyl ether and 8.0 g of γ-butyrolactone, together adopted as the organic solvent (e), were filtrated through a 0.2 μm polytetrafluoroethylene filter (manufactured by Sumitomo Electric Industries, Ltd.) to provide a positive type photosensitive resin composition (varnish) a. Using this varnish a, a developed film, cured film, and organic EL display device intended for sensitivity evaluation were prepared by the above procedure and subjected to sensitivity evaluation and evaluation of the long-term reliability of the organic EL display device. In this procedure, curing was performed at 250° C.

Reference Examples 2 to 16

Varnishes b to p were prepared by the same procedure as in Reference example 1 using the compounds listed in Table 1 in the quantities specified therein. Using each of these varnishes b to p, a developed film, cured film, and organic EL display device intended for sensitivity evaluation were prepared by the above procedure and subjected to sensitivity evaluation, determination of the total content of the compound (c) in the cured film, and evaluation of the long-term reliability of the organic EL display device. In this procedure, curing was performed at the temperatures specified in Table 1. For Reference examples of adjacent numbers, those cells containing the same data for the type of varnish used for forming planarizing layers and insulation layers (positive type photosensitive resin composition) or curing temperatures are combined into one cell for easy understanding. The names and structures of the compounds included in Table 1 are as follows.

A-1: alkali-soluble resin (A-1) obtained in Synthesis example 2

A-2: alkali-soluble resin (A-2) obtained in Synthesis example 3

A-3: alkali-soluble resin (A-3) obtained in Synthesis example 4

A-4: alkali-soluble resin (A-4) obtained in Synthesis example 5

B-1: quinone diazide compound (B-1) obtained in Synthesis example 6

B-2: quinone diazide compound (B-2) obtained in Synthesis example 7

C-1: N,N-dimethyl formamide (boiling point 153° C.)

C-2: N,N-dimethyl isobutylamide (boiling point 198° C.)

C-3: 3-methoxy-N,N-dimethyl propioneamide (boiling point 216° C.)

C-4: 3-butoxy-N,N-dimethyl propioneamide (boiling point 252° C.)

C-5: stearate amide (boiling point 250° C./12 mmHg, converted boiling point at atmospheric pressure 412° C.)

D-1: NC3000 (trade name, manufactured by Nippon Kayaku Co., Ltd.), epoxy compound adopted as thermal crosslinking agent (d)

D-2: HMOM-TPHAP (trade name, manufactured by Honshu Chemical Industry Co., Ltd.), acidic group-containing alkoxymethyl compound adopted as thermal crosslinking agent (d)

F: BIR-PC (trade name, manufactured by Asahi Organic Chemicals Industry Co., Ltd.), phenolic hydroxyl group-containing compound (f)

Evaluation results obtained in Reference examples 1 to 16 are shown in Table 1.

TABLE 1

| Varnish for planarizing layer and insulation layer | Alkali-soluble resin (a) | Photoacid generating agent (b) | Compound (c) | Thermal cross-linking agent (d) | Phenolic hydroxyl group-containing compound (f) | Curing conditions: 60 minutes at temperature given below | Photo-sensitive characteristic: sensitivity | Coat-ability: uneven coating | Content of compound (c) in cured film mass % | Organic EL device long-term reliability: pixel light emitting area (%) | | | |
|---|---|---|---|---|---|---|---|---|---|---|---|---|---|
| | | | | | | | | | | 250 hr | 500 hr | 1000 hr | 1500 hr |
| Reference example 1 | a A-1 10.0 g | B-1 1.2 g | C-1 0.1 g | D-1 2.0 g | 0.0 g | 250° C. | 200 mJ/cm² | ○ | | 90 | 70 | 40 | |
| Reference example 2 | b A-1 10.0 g | B-1 1.2 g | C-1 0.5 g | D-1 2.0 g | 0.0 g | | 200 mJ/cm² | ○ | | 90 | 70 | 50 | |
| Reference example 3 | c A-1 10.0 g | B-1 1.2 g | C-1 1.0 g | D-1 2.0 g | 0.0 g | | 200 mJ/cm² | ○ | | 90 | 70 | 50 | |
| Reference example 4 | d A-1 10.0 g | B-1 1.2 g | C-1 1.5 g | D-1 2.0 g | 0.0 g | | 220 mJ/cm² | ○ | | 90 | 75 | 55 | |
| Reference example 5 | e A-2 10.0 g | B-1 1.2 g | C-1 0.5 g | D-1 2.0 g | 0.0 g | | 300 mJ/cm² | ○ | | 90 | 70 | 50 | |
| Reference example 6 | f A-3 10.0 g | B-1 1.2 g | C-1 0.5 g | D-1 2.0 g | 0.0 g | | 250 mJ/cm² | ○ | | 90 | 70 | 50 | |
| Reference example 7 | g A-4 10.0 g | B-1 1.2 g | C-1 0.5 g | D-1 2.0 g | 0.0 g | | 650 mJ/cm² | ○ | | 90 | 60 | 30 | |
| Reference example 8 | h A-1 10.0 g | B-2 1.2 g | C-1 0.5 g | D-1 2.0 g | 0.0 g | | 180 mJ/cm² | ○ | | 100 | 85 | 65 | |
| Reference example 9 | i A-1 10.0 g | B-2 1.2 g | C-1 0.5 g | D-1 2.0 g | F 1.5 g | | 120 mJ/cm² | ○ | | 100 | 85 | 70 | |
| Reference example 10 | j A-1 10.0 g | B-2 1.2 g | C-1 0.5 g | D-2 2.0 g | F 1.5 g | | 100 mJ/cm² | ○ | | 100 | 90 | 75 | |
| Reference example 11 | k A-1 10.0 g | B-2 1.2 g | C-2 0.5 g | D-2 2.0 g | F 1.5 g | | 100 mJ/cm² | ○ | | 100 | 90 | 80 | |
| Reference example 12 | l A-1 10.0 g | B-2 1.2 g | C-3 0.5 g | D-2 2.0 g | F 1.5 g | | 100 mJ/cm² | ○ | | 100 | 90 | 85 | |
| Reference example 13 | m A-1 10.0 g | B-2 1.2 g | C-4 0.5 g | D-2 2.0 g | F 1.5 g | | 100 mJ/cm² | ○ | | 100 | 95 | 90 | |

TABLE 1-continued

| Varnish for planarizing layer and insulation layer | Alkali-soluble resin (a) | Photoacid generating agent (b) | Compound (c) | Thermal cross-linking agent (d) | Phenolic hydroxyl group-containing compound (f) | Curing conditions: 60 minutes at temperature given below | Photo-sensitive characteristic: sensitivity | Coat-ability: uneven coating | Content of compound (c) in cured film mass % | Organic EL device long-term reliability: pixel light emitting area (%) | | | |
|---|---|---|---|---|---|---|---|---|---|---|---|---|---|
| | | | | | | | | | | 250 hr | 500 hr | 1000 hr | 1500 hr |
| Reference example 14 | n | A-1 10.0 g | B-1 1.2 g | C-1 2.0 g | D-1 2.0 g | 0.0 g | | 270 mJ/cm² | ○ | | 90 | 75 | 55 | |
| Reference example 15 | o | A-1 10.0 g | B-1 1.2 g | C-1 0.5 g | D-3 2.0 g | 0.0 g | | 300 mJ/cm² | ○ | | 85 | 50 | 10 | |
| Reference example 16 | p | A-1 | B-2 | C-5 | D-2 | F | | 100 mJ/cm² | Δ | | 100 | 100 | 100 | |

Examples 1 to 41

Varnishes A to Q were prepared by the same procedure as in Reference example 1 using the compounds listed in Tables 2 to 4 in the quantities specified therein. Using each of these varnishes A to Q, a developed film, cured film, and organic EL display device intended for sensitivity evaluation were prepared by the above procedure and subjected to sensitivity evaluation, determination of the total content of the compound (c) in the cured film, and evaluation of the long-term reliability of the organic EL display device. In this procedure, curing was performed at the temperatures specified in Tables 2 to 4. For Examples of adjacent numbers, those cells containing the same data for the type of varnish used for forming planarizing layers and insulation layers (positive type photosensitive resin composition) or curing temperatures are combined into one cell for easy understanding. The names and structures of the compounds included in Tables 2 to 4 are as follows. (Descriptions of the compounds included in Table 1 are omitted.)

C-6: N-methyl-2-pyrrolidone (boiling point 203° C.)

C-7: 1,3-dimethyl-2-imidazolidinone (boiling point 220° C.)

C-8: N-cyclohexyl-2-pyrrolidone (boiling point 154° C./7 mmHg, converted boiling point at atmospheric pressure 305° C.)

C-9: N-(2-hydroxyethyl)-2-pyrrolidone (boiling point: 175° C./10 mmHg, converted boiling point at atmospheric pressure 313° C.)

Evaluation results obtained in Examples 1 to 41 are shown in Tables 2 to 4.

TABLE 2

| | Varnish for planarizing layer and insulation layer | Alkali-soluble resin (a) | Photo-acid generating agent (b) | Compound (c) | Thermal cross-linking agent (d) | Phenolic hydroxyl group-containing compound (f) | Curing conditions: 60 minutes at temperature given below | Photo-sensitive characteristic: sensitivity | Coat-ability: uneven coating | Content of compound (c) in cured film mass % | Organic EL device long-term reliability: pixel light emitting area (%) | | | |
|---|---|---|---|---|---|---|---|---|---|---|---|---|---|---|
| | | | | | | | | | | | 250 hr | 500 hr | 1000 hr | 1500 hr |
| Example 1 | A | A-1 10.0 g | B-1 1.2 g | C-6 0.5 g | D-1 2.0 g | 0.0 g | 250° C. | 200 mJ/cm² | ○ | 0.52% | 100 | 85 | 65 | 20 |
| Example 2 | B | A-2 10.0 g | B-1 1.2 g | C-6 0.5 g | D-1 2.0 g | 0.0 g | | 300 mJ/cm² | ○ | 0.53% | 100 | 85 | 65 | 20 |
| Example 3 | C | A-3 10.0 g | B-1 1.2 g | C-6 0.5 g | D-1 2.0 g | 0.0 g | | 250 mJ/cm² | ○ | 0.51% | 100 | 85 | 65 | 20 |
| Example 4 | D | A-4 10.0 g | B-1 1.2 g | C-6 0.5 g | D-1 2.0 g | 0.0 g | | 650 mJ/cm² | ○ | 0.45% | 100 | 80 | 45 | 0 |
| Example 5 | E | A-1 10.0 g | B-2 1.2 g | C-6 0.5 g | D-1 2.0 g | 0.0 g | | 180 mJ/cm² | ○ | 0.50% | 100 | 95 | 85 | 40 |
| Example 6 | F | A-1 10.0 g | B-2 1.2 g | C-6 0.5 g | D-1 2.0 g | F 1.5 g | | 120 mJ/cm² | ○ | 0.32% | 100 | 95 | 85 | 50 |
| Example 7 | G | A-1 10.0 g | B-2 1.2 g | C-6 0.5 g | D-2 2.0 g | F 1.5 g | | 100 mJ/cm² | ○ | 0.52% | 100 | 100 | 90 | 60 |
| Example 8 | H | A-1 | B-2 | C-6 | D-1 | F | 230° C. | 100 mJ/cm² | ○ | 0.09% | 100 | 100 | 80 | 40 |
| Example 9 | | | | | | | 250° C. | 100 mJ/cm² | ○ | 0.065% | 100 | 100 | 80 | 35 |
| Example 10 | | 10.0 g | 1.2 g | 0.1 g | 2.0 g | 1.5 g | 270° C. | 100 mJ/cm² | ○ | 0.02% | 100 | 100 | 75 | 25 |
| Example 11 | | | | | | | 300° C. | 100 mJ/cm² | ○ | 0.006% | 100 | 95 | 60 | 15 |
| Example 12 | G | A-1 | B-2 | C-6 | D-2 | F | 230° C. | 100 mJ/cm² | ○ | 0.78% | 100 | 100 | 90 | 60 |
| Example 13 | | 10.0 g | 1.2 g | 0.5 g | 2.0 g | 1.5 g | 270° C. | 100 mJ/cm² | ○ | 0.33% | 100 | 100 | 90 | 60 |
| Example 14 | | | | | | | 300° C. | 100 mJ/cm² | ○ | 0.23% | 100 | 100 | 80 | 40 |

TABLE 3

| | Varnish for planarizing layer and insulation layer | Alkali-soluble resin (a) | Photo-acid generating agent (b) | Compound (c) | Thermal cross-linking agent (d) | Phenolic hydroxyl group-containing compound (f) | Curing conditions: 60 minutes at temperature given below | Photo-sensitive characteristic: sensitivity | Coatability: uneven coating | Content of compound (c) in cured film mass % | Organic EL device long-term reliability: pixel light emitting area (%) | | | |
|---|---|---|---|---|---|---|---|---|---|---|---|---|---|---|
| | | | | | | | | | | | 250 hr | 500 hr | 1000 hr | 1500 hr |
| Example 15 | I | A-1 | B-2 | C-6 | D-2 | F | 230° C. | 100 mJ/cm$^2$ | ○ | 1.3% | 100 | 100 | 100 | 90 |
| Example 16 | | | | | | | 250° C. | 100 mJ/cm$^2$ | ○ | 1.1% | 100 | 100 | 95 | 80 |
| Example 17 | | 10.0 g | 1.2 g | 0.1 g | 2.0 g | 1.5 g | 270° C. | 100 mJ/cm$^2$ | ○ | 0.82% | 100 | 100 | 90 | 65 |
| Example 18 | | | | | | | 300° C. | 100 mJ/cm$^2$ | ○ | 0.30% | 100 | 100 | 85 | 50 |
| Example 19 | J | A-1 | B-2 | C-6 | D-2 | F | 230° C. | 120 mJ/cm$^2$ | ○ | 3.0% | 100 | 100 | 95 | 85 |
| Example 20 | | | | | | | 250° C. | 120 mJ/cm$^2$ | ○ | 2.5% | 100 | 100 | 100 | 85 |
| Example 21 | | 10.0 g | 1.2 g | 1.5 g | 2.0 g | 1.5 g | 270° C. | 120 mJ/cm$^2$ | ○ | 1.9% | 100 | 100 | 100 | 90 |
| Example 22 | | | | | | | 300° C. | 120 mJ/cm$^2$ | ○ | 1.2% | 100 | 100 | 100 | 90 |
| Example 23 | K | A-1 10.0 g | B-1 1.2 g | C-6 2.0 g | D-2 2.0 g | F 1.5 g | 250° C. | 170 mJ/cm$^2$ | ○ | 3.2% | 100 | 100 | 90 | 65 |
| Example 24 | L | A-1 10.0 g | B-2 1.2 g | C-7 0.5 g | D-2 2.0 g | F 1.5 g | 250° C. | 100 mJ/cm$^2$ | ○ | 1.0% | 100 | 100 | 95 | 75 |
| Example 25 | M | A-1 | B-2 | C-8 | D-2 | F | 230° C. | 100 mJ/cm$^2$ | ○ | 0.23% | 100 | 100 | 80 | 45 |
| Example 26 | | | | | | | 250° C. | 100 mJ/cm$^2$ | ○ | 0.18% | 100 | 100 | 80 | 40 |
| Example 27 | | 10.0 g | 1.2 g | 0.1 g | 2.0 g | 1.5 g | 270° C. | 100 mJ/cm$^2$ | ○ | 0.13% | 100 | 100 | 75 | 40 |
| Example 28 | | | | | | | 300° C. | 100 mJ/cm$^2$ | ○ | 0.05% | 100 | 100 | 80 | 35 |

TABLE 4

| | Varnish for planarizing layer and insulation layer | Alkali-soluble resin (a) | Photoacid generating agent (b) | Compound (c) | Thermal cross-linking agent (d) | Phenolic hydroxyl group-containing compound (f) | Curing conditions: 60 minutes at temperature given below | Photo-sensitive characteristic: sensitivity | Coatability: uneven coating | Content of compound (c) in cured film mass % | Organic EL device long-term reliability: pixel light emitting area (%) | | | |
|---|---|---|---|---|---|---|---|---|---|---|---|---|---|---|
| | | | | | | | | | | | 250 hr | 500 hr | 1000 hr | 1500 hr |
| Example 29 | N | A-1 | B-2 | C-8 | D-2 | F | 230° C. | 100 mJ/cm$^2$ | ○ | 1.9% | 100 | 100 | 100 | 90 |
| Example 30 | | | | | | | 250° C. | 100 mJ/cm$^2$ | ○ | 1.7% | 100 | 100 | 100 | 90 |
| Example 31 | | 10.0 g | 1.2 g | 0.5 g | 2.0 g | 1.5 g | 270° C. | 100 mJ/cm$^2$ | ○ | 1.5% | 100 | 100 | 100 | 90 |
| Example 32 | | | | | | | 300° C. | 100 mJ/cm$^2$ | ○ | 0.9% | 100 | 100 | 100 | 70 |
| Example 33 | O | A-1 | B-2 | C-8 | D-2 | F | 230° C. | 100 mJ/cm$^2$ | ○ | 3.3% | 100 | 100 | 90 | 70 |
| Example 34 | | | | | | | 250° C. | 100 mJ/cm$^2$ | ○ | 2.9% | 100 | 100 | 100 | 85 |
| Example 35 | | 10.0 g | 1.2 g | 1.0 g | 2.0 g | 1.5 g | 270° C. | 100 mJ/cm$^2$ | ○ | 2.6% | 100 | 100 | 95 | 85 |
| Example 36 | | | | | | | 300° C. | 100 mJ/cm$^2$ | ○ | 1.5% | 100 | 100 | 100 | 90 |
| Example 37 | P | A-1 | B-2 | C-8 | D-2 | F | 230° C. | 100 mJ/cm$^2$ | ○ | 4.8% | 100 | 100 | 85 | 50 |
| Example 38 | | | | | | | 250° C. | 100 mJ/cm$^2$ | ○ | 4.5% | 100 | 100 | 90 | 60 |
| Example 39 | | 10.0 g | 1.2 g | 1.5 g | 2.0 g | 1.5 g | 270° C. | 100 mJ/cm$^2$ | ○ | 4.2% | 100 | 100 | 90 | 60 |
| Example 40 | | | | | | | 300° C. | 100 mJ/cm$^2$ | ○ | 3.0% | 100 | 100 | 100 | 85 |
| Example 41 | Q | A-1 10.0 g | B-2 1.2 g | C-9 0.5 g | D-2 2.0 g | F 1.5 g | 250° C. | 100 mJ/cm$^2$ | ○ | 2.0% | 100 | 100 | 100 | 90 |

Comparative Examples 1 to 9

Varnishes G and R to X were prepared by the same procedure as in Reference example 1 using the compounds listed in Table 5 in the quantities specified therein. Using each of these varnishes G and R to X, a developed film, cured film, and organic EL display device intended for sensitivity evaluation were prepared by the above procedure and subjected to sensitivity evaluation, determination of the total content of the compound (c) in the cured film, and evaluation of the long-term reliability of the organic EL display device. In this procedure, curing was performed at the temperatures specified in Table 5. For Examples of adjacent numbers, those cells containing the same data for the type of varnish used for forming planarizing layers and insulation layers (positive type photosensitive resin composition) or curing temperatures are combined into one cell for easy understanding. The names and structures of the compounds included in Table 5 are as follows. (Descriptions of the compounds included in Tables 1 to 4 are omitted.)

C-10: aniline (boiling point 184° C.), not suitable as compound (c)

C-11: 1-methylimidazole (boiling point 198° C.), not suitable as compound (c)

D'-3: NIKALAC MW-100LM (trade name, manufactured by Sanwa Chemical Co., Ltd.), melamine-based thermal crosslinking agent, not suitable as thermal crosslinking agent (d)

Evaluation results obtained in Comparative examples 1 to 9 are shown in Table 5.

TABLE 5

| | Varnish for planarizing layer and insulation layer | Alkali-soluble resin (a) | Photo-acid generating agent (b) | Compound (c) | Thermal crosslinking agent (d) | Phenolic hydroxyl group-containing compound (f) | Curing conditions: 60 minutes at temperature given below | Photo-sensitive characteristic: sensitivity | Coat-ability: uneven coating | Content of compound (c) in cured film mass % | Organic EL device long-term reliability: pixel light emitting area (%) | | | |
|---|---|---|---|---|---|---|---|---|---|---|---|---|---|---|
| | | | | | | | | | | | 250 hr | 500 hr | 1000 hr | 1500 hr |
| Comparative example 1 | R | A-1 10.0 g | B-1 1.2 g | 0.0 g | D-1 2.0 g | 0.0 g | 250° C. | 200 mJ/cm² | ○ | 0.000% | 85 | 50 | 10 | 0 |
| Comparative example 2 | S | A-2 10.0 g | B-1 1.2 g | 0.0 g | D-1 2.0 g | 0.0 g | | 300 mJ/cm² | ○ | 0.000% | 85 | 50 | 10 | 0 |
| Comparative example 3 | T | A-3 10.0 g | B-1 1.2 g | 0.0 g | D-1 2.0 g | 0.0 g | | 250 mJ/cm² | ○ | 0.000% | 85 | 50 | 10 | 0 |
| Comparative example 4 | U | A-4 10.0 g | B-1 1.2 g | 0.0 g | D-1 2.0 g | 0.0 g | | 650 mJ/cm² | ○ | 0.000% | 85 | 25 | 0 | 0 |
| Comparative example 5 | V | A-1 10.0 g | B-1 1.2 g | C-10 0.5 g | D-1 2.0 g | 0.0 g | | 200 mJ/cm² | ○ | 0.000% | 80 | 45 | 10 | 0 |
| Comparative example 6 | W | A-1 10.0 g | B-1 1.2 g | C-11 0.5 g | D-1 2.0 g | 0.0 g | | 200 mJ/cm² | ○ | 0.000% | 80 | 45 | 10 | 0 |
| Comparative example 7 | X | A-1 10.0 g | B-1 1.2 g | C-6 0.5 g | D'-3 2.0 g | 0.0 g | | 300 mJ/cm² | ○ | 0.32% | 90 | 55 | 20 | 0 |
| Comparative example 8 | G | A-1 10.0 g | B-2 1.2 g | C-6 0.5 g | D-2 2.0 g | F 1.5 g | 200° C. | 100 mJ/cm² | ○ | 6.4% | 90 | 60 | 20 | 0 |
| Comparative example 9 | | 10.0 g | 1.2 g | 0.5 g | 2.0 g | | 400° C. | 100 mJ/cm² | ○ | 0.002% | 90 | 55 | 20 | 0 |

*C-10 and C-11 are not suitable as compound (c).
*D'-3 is not suitable as thermal crosslinking agent (d).

EXPLANATION OF NUMERALS

1: glass substrate
2: planarization layer
3: reflecting electrode
4: first electrode
5: auxiliary electrode
6: insulation layer
7: organic EL layer
8: second electrode

The invention claimed is:

1. An organic EL display element comprising a cured film, wherein said cured film comprises a cured product of a photosensitive resin composition including:
an alkali-soluble resin (a),
a photoacid generating agent (b),
at least one compound (c) selected from the group consisting of cyclic amides, cyclic ureas, and derivatives thereof, and
a thermal crosslinking agent (d),
wherein the thermal crosslinking agent (d) contains an epoxy compound, oxetanyl compound, isocyanate compound, acidic group-containing alkoxymethyl compound, and/or acidic group-containing methylol compound, and wherein the total content of the compound (c) in the cured film being 0.005 mass % or more and 5 mass % or less.

2. The organic EL display element as set forth in claim 1, wherein the compound (c) has a boiling point of 210° C. or more.

3. The organic EL display element as set forth in claim 2, wherein the compound (c) has a boiling point of 210° C. or more and 400° C. or less.

4. The organic EL display element as set forth in claim 1, wherein the compound (c) has a structure as represented by general formula (1):

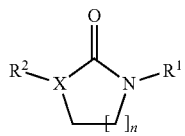

(1)

wherein in general formula (1), n denotes an integer of 1 to 4; X denotes CH or a nitrogen atom; and $R^1$ and $R^2$ each independently represent a hydrogen atom or an organic group having 1 to 20 carbon atoms, $R^1$ being an organic group containing 2 to 20 carbon atoms when X is CH, and being a hydrogen atom or an organic group containing 1 to 20 carbon atoms when X is a nitrogen atom, and $R^2$ being a hydrogen atom when X is CH, and being a hydrogen atom or an organic group containing 1 to 20 carbon atoms when X is a nitrogen atom.

5. The organic EL display element as set forth in claim 1, wherein the compound (c) includes N-cyclohexylpyrrolidone and/or N-(2-hydroxyethyl)-2-pyrrolidone.

6. The organic EL display element as set forth in claim 1, wherein the alkali-soluble resin (a) includes a polyimide precursor, polyimide, polybenzoxazole precursor, polybenzoxazole, and/or copolymer thereof.

7. The organic EL display element as set forth in claim 1, wherein the thermal crosslinking agent (d) includes an acidic group-containing alkoxymethyl compound and/or an acidic group-containing methylol compound.

8. The organic EL display element as set forth in claim 1, wherein the photoacid generating agent (b) includes a 4-naphthoquinone diazide sulfonyl ester compound.

9. The organic EL display element as set forth in claim 1, wherein said photosensitive resin composition further comprises a phenolic hydroxyl group-containing compound (f).

10. The organic EL display element as set forth in claim 1, wherein the opening rate of the cured film in the display area is 20% or less.

* * * * *